(12) United States Patent
Chang et al.

(10) Patent No.: US 11,856,761 B2
(45) Date of Patent: Dec. 26, 2023

(54) SEMICONDUCTOR MEMORY DEVICES WITH DIFFERENT DOPING TYPES

(71) Applicant: Taiwan Semiconductor Manufacturing Company, Ltd., Hsinchu (TW)

(72) Inventors: Meng-Sheng Chang, Chubei (TW); Chia-En Huang, Xinfeng Township (TW); Chun Chung Su, New Taipei (TW); Wen-Hsing Hsieh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 118 days.

(21) Appl. No.: 17/477,196

(22) Filed: Sep. 16, 2021

(65) Prior Publication Data

US 2022/0359546 A1 Nov. 10, 2022

Related U.S. Application Data

(60) Provisional application No. 63/185,526, filed on May 7, 2021.

(51) Int. Cl.
*H10B 20/20* (2023.01)
*H01L 29/41* (2006.01)
(Continued)

(52) U.S. Cl.
CPC .......... *H10B 20/20* (2023.02); *G11C 11/4023* (2013.01); *G11C 17/12* (2013.01);
(Continued)

(58) Field of Classification Search
CPC ........ H10B 20/20; H10B 20/25; H10B 20/30; H10B 20/367; H10B 20/60; G11C 11/4023; G11C 17/12; G11C 17/123; G11C 17/16; G11C 17/165; G11C 17/18; H01L 29/413; H01L 23/573; H01L 29/42392;
(Continued)

(56) References Cited

U.S. PATENT DOCUMENTS 7,738,312 B2 * 6/2010 Shimano .................. G11C 7/12
365/207
9,236,417 B2 * 1/2016 Park ...................... H10B 63/30
(Continued)

*Primary Examiner* — Allison Bernstein
(74) *Attorney, Agent, or Firm* — FOLEY & LARDNER LLP

(57) ABSTRACT

A semiconductor device includes first nanostructures vertically separated from one another, a first gate structure wrapping around each of the first nanostructures, and second nanostructures vertically separated from one another. The semiconductor device also includes a second gate structure wrapping around the second nanostructures, a first drain/source structure coupled to a first end of the first nanostructures, a second drain/source structure coupled to both of a second end of the first nanostructures and a first end of the second nanostructures, and a third drain/source structure coupled to a second end of the second nanostructures. The first drain/source structure has a first doping type, the second and third drain/source structures have a second doping type, and the first doping type is opposite to the second doping type.

18 Claims, 19 Drawing Sheets

(51) Int. Cl.
*G11C 11/402* (2006.01)
*G11C 17/12* (2006.01)
*G11C 17/16* (2006.01)
*H10B 20/00* (2023.01)
*H10B 20/25* (2023.01)
*H01L 23/00* (2006.01)

(52) U.S. Cl.
CPC ............ *G11C 17/123* (2013.01); *G11C 17/16* (2013.01); *G11C 17/165* (2013.01); *H01L 29/413* (2013.01); *H10B 20/25* (2023.02); *H10B 20/30* (2023.02); *H10B 20/367* (2023.02); *H10B 20/60* (2023.02); *H01L 23/573* (2013.01)

(58) Field of Classification Search
CPC ......... H01L 29/78696; H01L 29/66545; H01L 23/5252; H01L 29/0673; H01L 29/66439; H01L 29/775; H01L 29/785; H01L 29/0607; H01L 29/0665; B82Y 10/00
See application file for complete search history.

(56) References Cited

U.S. PATENT DOCUMENTS

| | | | |
|---|---|---|---|
| 10,586,832 B2* | 3/2020 | Chung | H10N 70/8828 |
| 11,563,015 B2* | 1/2023 | Chang | H01L 23/5252 |
| 2016/0049187 A1* | 2/2016 | Adachi | H10B 10/12 |
| | | | 365/154 |
| 2020/0287020 A1* | 9/2020 | Seo | H01L 29/78696 |
| 2023/0098708 A1* | 3/2023 | Chang | H01L 29/42392 |
| | | | 365/185.05 |

* cited by examiner

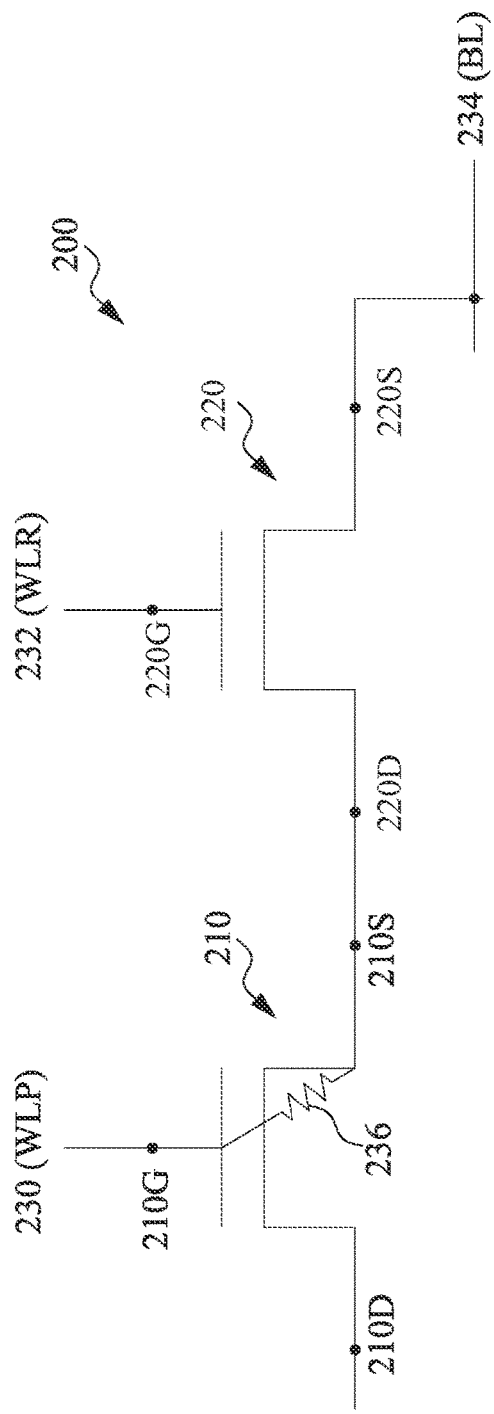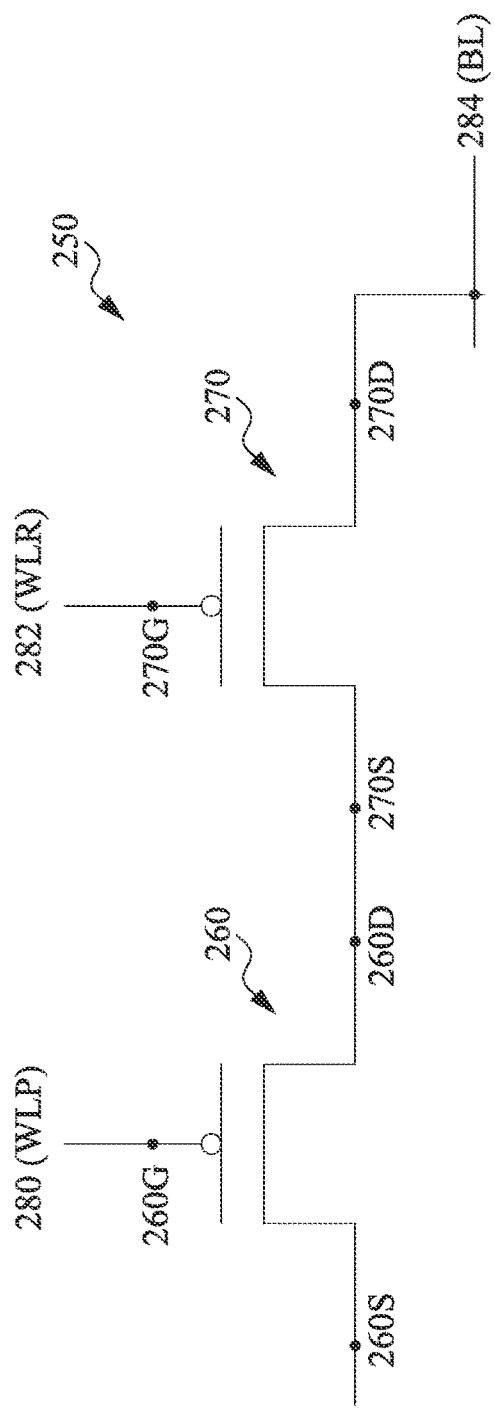
FIG. 2A
FIG. 2B

SEMICONDUCTOR MEMORY DEVICES WITH DIFFERENT DOPING TYPES

CROSS-REFERENCE TO RELATED APPLICATION

This application claims priority to and the benefit of U.S. Provisional Application No. 63/185,526, filed May 7, 2021, entitled "ANOVELNANO-SHEET STRUCTURE FOR OTP PROGRAM ENHANCEMENT," which is incorporated herein by reference in its entirety for all purposes.

BACKGROUND

Integrated circuits (ICs) sometimes include one-time-programmable (OTP) memories to provide non-volatile memory (NVM) in which data are not lost when the IC is powered off. One type of the OTP devices includes anti-fuse memories. The anti-fuse memories include a number of anti-fuse memory cells (or bit cells), whose terminals are disconnected before programming, and are shorted (e.g., connected) after the programming. The anti-fuse memories may be based on metal-oxide-semiconductor (MOS) technology. For example, an anti-fuse memory cell may include a programming MOS transistor (or MOS capacitor) and at least one reading MOS transistor. A gate dielectric of the programming MOS transistor may be broken down to cause the gate and the source or drain sub-feature of the programming MOS transistor to be interconnected. Depending on whether the gate dielectric of the programming MOS transistor is broken down, different data bits can be presented by the anti-fuse memory cell through reading a resultant current flowing through the programming MOS transistor and reading MOS transistor. The anti-fuse memories have the advantageous features of reverse-engineering proofing, since the programming states of the anti-fuse cells cannot be determined through reverse engineering.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A illustrates an example circuit diagram of a memory cell, in accordance with some embodiments.

FIG. 2B illustrates an example circuit diagram of another memory cell, in accordance with some embodiments.

DETAILED DESCRIPTION

Figure 1A:
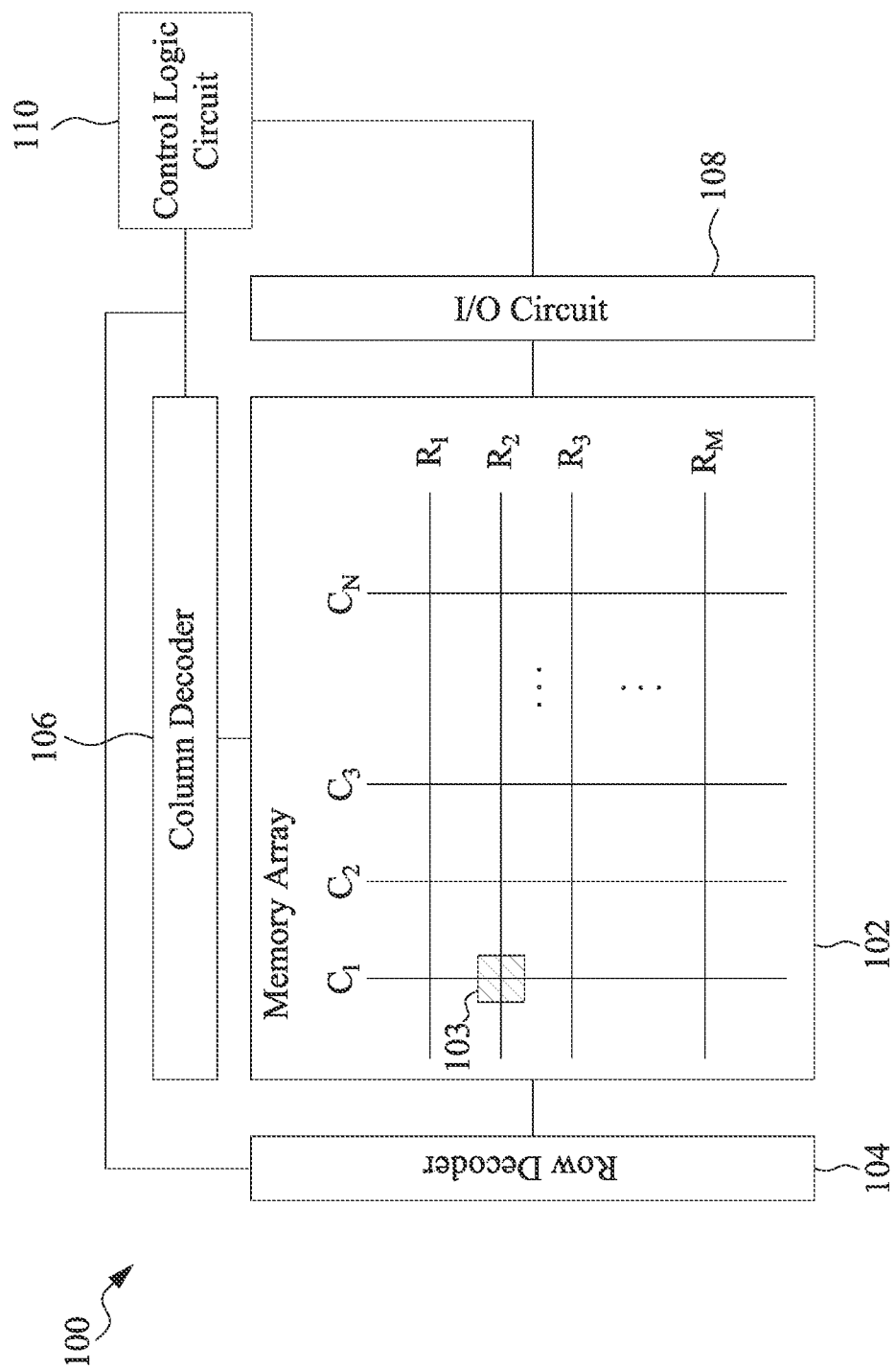
FIG. 1A illustrates a memory device, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, non-planar transistor device architectures, such as fin-based transistors, can provide increased device density and increased performance over planar transistors. Some advanced non-planar transistor device architectures, such as nanostructure transistors, can further increase the performance over fin-based transistors. Example nanostructure transistors include nanostructure transistors, nanowire transistors, and the like. The nanostructure transistor includes one or more nanostructures, collectively configured as a conduction channel of the transistor, that are fully wrapped by a gate stack. When compared to the fin-based transistors where the channel is partially wrapped by a gate stack, the nanostructure transistor, in general, includes one or more gate stacks that wrap around the full perimeter of a nanostructure channel. As such, control over the nanostructure channel may be further improved, thus causing, for example, a relatively large driving current given the similar sizes of the fin-based transistor and nanostructure transistor.

As mentioned above, an anti-fuse memory cell includes at least a programming transistor and a reading transistor. Typically, cells of an anti-fuse memory array are formed as an array, with each cell disposed at an intersection of one of plural columns and one of plural rows. For example, a number of cells are disposed along one of the rows, and these cells can share one or more access lines (e.g., a programming word line (WLP), a reading word line (WLR)) in this row. Specifically, respective programming transistors of these cells are gated by a single WLP. As such, when one of the cells is selected to be programmed, unselected cells may contribute leakage through their gates (gate leakage current) and then the shared WLP. The leakage current is largely due to the p-n junction at the intersection of the source/drain (which is typically doped with n-type dopants) and channel (which is typically doped with p-type dopants). This leakage current can disadvantageously induce a certain amount of IR (current-resistance) drop on the WLP, which may in turn requires a higher voltage level to successfully program the selected cell. Consequently, performance and lifetime of the anti-fuse memory are negatively affected. Thus, the existing anti-fuse memory has not been entirely satisfactory in many aspects.

The present disclosure provides various embodiments of a memory device including a number of memory cells, each of which includes an anti-fuse memory cell constituted by a programming transistor and a reading transistor. Each of the programming transistor and reading transistor(s) includes a nanostructure transistor that may outperform other non-planar transistor device architectures. Further, to solve the above-discussed issues, one of the source/drain of each programming transistor that is floating can be doped in a reverse conduction type (e.g., p-type), when compared to the other source/drain and both source/drain of each reading transistor. As such, the p-n junction between the floating source/drain and a portion of the channel abutting and/or close to the floating source/drain can disappear or be significantly reduced. Consequently, a gate leakage from a gate of the (e.g., unselected) programming transistor can be greatly reduced such that a programming voltage is not disadvantageously to be increased while being able to successfully program the disclosed memory cell.

FIG. 1A illustrates a memory device 100, in accordance with various embodiments. In the illustrated embodiment of FIG. 1A, the memory device 100 includes a memory array 102, a row decoder 104, a column decoder 106, an input/output (I/O) circuit 108, and a control logic circuit 110. Despite not being shown in FIG. 1A, all of the components of the memory device 100 may be operatively coupled to each other and to the control logic circuit 110. Although, in the illustrated embodiment of FIG. 1A, each component is shown as a separate block for the purpose of clear illustration, in some other embodiments, some or all of the components shown in FIG. 1A may be integrated together. For example, the memory array 102 may include an embedded I/O circuit 108.

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1, R_2, R_3 \ldots R_M$, each extending in a first direction (e.g., X-direction) and a number of columns $C_1, C_2, C_3 \ldots C_N$, each extending in a second direction (e.g., Y-direction). Each of the rows/columns may include one or more conductive structures each configured as an access line (e.g., a programming word line (WLP), a reading word line (WLR), a bit line (BL)), which will be discussed below. In some embodiments, each memory cell 103 is arranged in the intersection of a corresponding row and a corresponding column and can be operated according to voltages or currents through the respective conductive structures of the column and row.

In one aspect of the present disclosure, each memory cell 103 is implemented as an anti-fuse memory cell that includes a first transistor and a second transistor coupled in series. The first transistor can be a programming transistor, and the second transistor can be a reading transistor. Although the present disclosure is directed to implementing the memory cell 103 as an anti-fuse memory cell, it should be understood that the memory cell 103 can include any of various other memory cells, while remaining within the scope of present disclosure.

The row decoder 104 is a hardware component that can receive a row address of the memory array 102 and assert a conductive structure (e.g., a word line) at that row address.

The column decoder 106 is a hardware component that can receive a column address of the memory array 102 and assert one or more conductive structures (e.g., a bit line, a source line) at that column address. The I/O circuit 108 is a hardware component that can access (e.g., read, program) each of the memory cells 103 asserted through the row decoder 104 and column decoder 106. The control logic circuit 110 is a hardware component that can control the coupled components (e.g., 102 through 108).

Figure 1B:
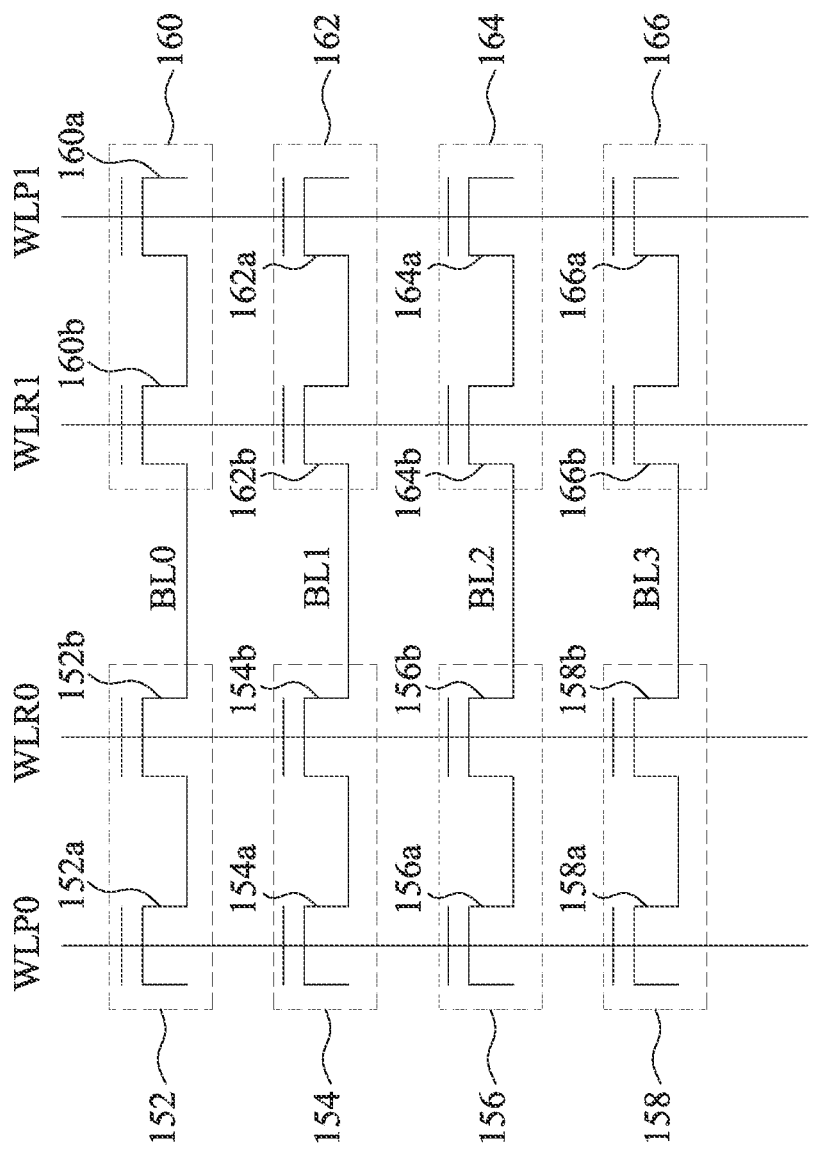
FIG. 1B illustrates an example circuit diagram of a portion of the memory device of FIG. 1A, in accordance with some embodiments.

FIG. 1B illustrates an example circuit diagram of a portion of the memory device 100, in accordance with some embodiments. In the illustrated example of FIG. 1B, anti-fuse memory cells 152, 154, 156, 158, 160, 162, 164, and 166 of the memory array 102 are shown. Although eight anti-fuse memory cells 152-156 are shown, it should be appreciated that the memory array 102 can have any number of anti-fuse memory cells, while remaining within the scope of present disclosure. Memory cells 152, 154, 156, 158, 160, 162, 164, and 166 respectively includes programming transistors 152a, 154a, 156a, 158a, 160a, 162a, 164a, and 166a and reading transistors 152b, 154b, 156b, 158b, 160b, 162b, 164b, and 166b.

Each of the programming transistors 152a-158a has a first source/drain (S/D) terminal that is floating, a gate terminal connected to a programming word line (e.g., first access line) WLP0, and a second S/D terminal of connected to a first S/D terminal of the reading transistors 152b-158b. Each of the reading transistors 152b-158b has a gate terminal connected to a reading word line (e.g., second access line) WLR0 and a second S/D terminal respectively connected to bit lines BL0, BL1, BL2, and BL3. Each of the reading transistors 160b-166b have a first S/D terminal respectively connected to the bit lines BL0-BL3, a gate terminal connected to the reading word line WLR1, and a second S/D terminal respectively connected to first S/D terminals of the programming transistors 160a-166a. Each of the programming transistors 160a-166a has a gate terminal connected to a programming word line WLP1 and a second S/D terminal that is floating.

The programming word lines WLP0 and WLP1 and the reading word lines WLR0 and WLR1 can be operatively coupled to the I/O circuit 108 through the row decoder 104. Said another way, the programming word lines (e.g., WLP0, WLP1) and reading word lines (e.g., WLR0, WLR1) may extend along respective rows of an array (e.g., $R_1, R_2, R_3 \ldots R_M$), in some embodiments. Further, each pair of the programming and reading word lines, e.g., (WLP0, WLR0), (WLP1, WLR1) may be disposed in a respective one of the rows, in some embodiments. The bit lines BL0-BL3 can be operatively coupled to the I/O circuit 108 (which can include one or more sense amplifiers (not shown)) through the column decoder 106. Said another way, the bit lines (e.g., BL0, BL1, BL2, BL3) may extend along respective columns of an array (e.g., $C_1, C_2, C_3 \ldots C_N$), in some embodiments. Further, each of the bit lines may be disposed in a respective one of the columns, in some embodiments. Accordingly, each of the memory cells 152-166 can be individually selected to be programmed or read.

FIG. 2A illustrates an example circuit diagram of a memory cell 200 (e.g., memory cells 152-166), in accordance with some embodiments. As shown, the memory cell (or sometimes referred to as a memory bit cell, a memory bit, or a bit) 200 includes a first transistor 210 (or programming transistor, e.g., programming transistors 152a-166a) and a second transistor 220 (or reading transistor, e.g., reading transistors 152b-166b). Each of the first and second transistors, 210 and 220, may include an n-type metal-oxidesemiconductor field-effect-transistor (n-type MOSFET) or sometimes referred to as an NMOS transistor. In some embodiments, the transistor 210 may not be a typical n-type transistor as the drain 210D is floating and has P+ doping opposite to the N+ doping of the source 210S (e.g., a p-type drain/n-type source transistor (PNMOS)), which will be discussed in further detail below. In some other embodiments, the transistors 210 and 220 may include another type of the MOSFET, e.g., a p-type MOSFET or sometimes referred to as a PMOS transistor, which shall be discussed below with respect to FIG. 2B. The transistor 210 may not be a typical p-type transistor as the drain 210D is floating and has N+ doping opposite to the P+ doping of the source 210S (e.g., an n-type drain/p-type source (NPMOS)), which will be discussed in further detail below. In some other embodiments, at least one of the transistors 210 or 220 may be replaced by another type of electronic devices, e.g., a MOS capacitor, while remaining within the scope of the present disclosure. The first transistor 210 and the second transistor 220 are electrically coupled to each other in series. For example, source of the first transistor 210, 210S, is connected to drain of the second transistor 220, 220D.

The memory cell 200 may be configured as an OTP memory cell such as, for example, an anti-fuse cell. It is understood that the memory cell 200 may be configured as any type of the memory cell that includes two transistors electrically coupled to each other in series (e.g., a NOR-type non-volatile memory cell, a dynamic random-access memory (DRAM) cell, a two-transistor static random-access memory (SRAM) cell, etc.).

When the memory cell 200 is configured as an anti-fuse cell, the first transistor 210 can function as a programming transistor and the second transistor 220 can function as a reading transistor. As such, drain 210D of the first transistor 210 is floating (e.g., coupled to nothing), and gate 210G of the first transistor 210 is coupled to a programming word line (WLP) 230 (e.g., word lines WLP0-WLP1); and gate 220G of the second transistor 220 is coupled to a reading word line (WLR) 232 (e.g., word lines WLR0-WLR1), and source 220S of the second transistor 220 is coupled to a bit line (BL) 234 (e.g., bit lines BL0-BL3).

To program the memory cell 200, the reading transistor 220 is turned on by supplying a high voltage (e.g., a positive voltage corresponding to a logic high state) to the gate 220G via the WLR 232. Prior to, concurrently with or subsequently to the reading transistor 220 being turned on, a sufficiently high voltage (e.g., a breakdown voltage ($V_{BD}$)) is applied to the WLP 230, and a low voltage (e.g., a positive voltage corresponding to a logic low state) is applied to the BL 234. The low voltage (applied on the BL 234) can be passed to the source 210S such that $V_{BD}$ will be created across the source 210S and the gate 210G to cause a breakdown of a portion of a gate dielectric (e.g., the portion between the source 210S and the gate 210G) of the programming transistor 210. After the gate dielectric of the programming transistor 210 is broken down, a behavior of the portion of the gate dielectric interconnecting the gate 210G and source 210S is equivalently resistive. For example, such a portion may function as a resistor 236. Before the programming (before the gate dielectric of the programming transistor 210 is broken down), no conduction path exists between the BL 234 and the WLP 230, when the reading transistor 220 is turned on; and after the programming, a conduction path exists between the BL 234 and the WLP 230 (e.g., via the resistor 236), when the reading transistor 220 is turned on.

To read the memory cell 200, similarly to the programming, the reading transistor 220 is turned on and the BL 234 is coupled to a voltage corresponding to the logic low state. In response, a positive voltage is applied to the gate of the programming transistor 210G. As discussed above, if the gate dielectric of the programming transistor 210 is not broken down, no conduction path exists between the BL 234 and the WLP 230. Thus, a relatively low current conducts from the WLP 230, through the transistors 210 and 220, and to the BL 234. If the gate dielectric of the programming transistor 210 is broken down, a conduction path exists between the BL 234 and the WLP 230. Thus, a relatively high current conducts from the WLP 230, through the transistor 210 (now equivalent to the resistor 236) and transistor 220, and to the BL 234. Such a low current and high current may sometimes be referred to as $I_{off}$ and $I_{on}$ of the memory cell 210, respectively. A circuit component (e.g., a sense amplifier), coupled to the BL 234 can differentiate $I_{off}$ from $I_{on}$ (or vice versa), and thus determine whether the memory cell 200 presents a logic high ("1") or a logic low ("0"). For example, when $I_{on}$ is read, the memory cell 200 may present 1; and when $I_{off}$ is read, the memory cell 200 may present 0.

FIG. 2B illustrates an example circuit diagram of another memory cell 250, in accordance with some embodiments. The memory cell 250 is similar as the memory cell 200 of FIG. 2A, except that the memory cell 250 is constituted by p-type MOSFETs. As shown, the memory cell 250 includes a first transistor 260 and a second transistor 270. Each of the first and second transistors, 260 and 270, may include a p-type MOSFET. The first transistor 260 and the second transistor 270 are electrically coupled to each other in series. For example, drain of the first transistor, 260D, is connected to source of the second transistor, 270S. The memory cell 250 may function as an anti-fuse cell (as discussed above), where the first transistor 260 functions as a programming transistor of the anti-fuse cell and the second transistor 270 functions as a reading transistor of the anti-fuse cell. Similar to the memory cell 200, the gate of the programming transistor 260G is coupled to a WLP 280, the gate of the reading transistor 270G is coupled to a WLR 282, and the drain of the reading transistor 270D is coupled to a BL 284. Operations of the memory cell 250 is substantially similar to the operations of the memory cell 200 (except for the polarity of the voltages applied to the WLP 280, WLR 282, and BL 284), and thus, the discussion shall not be repeated.

Figure 3A:
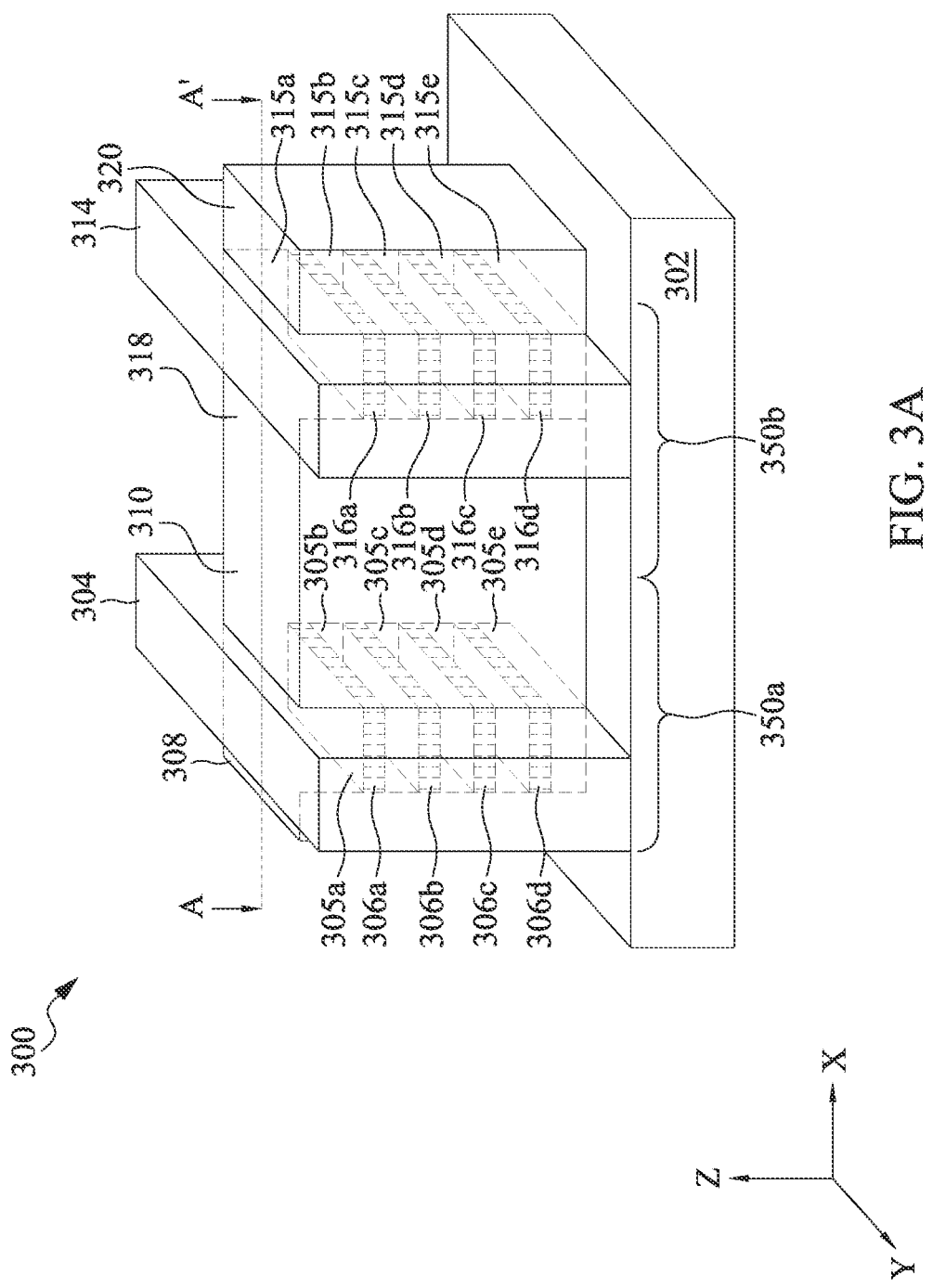
FIG. 3A illustrates a perspective view of a memory cell in a nanostructure transistor configuration, in accordance with some embodiments.

FIG. 3A illustrates a perspective view of a memory cell 300 (e.g., memory cell 200) in a nanostructure transistor configuration, in accordance with some embodiments. In accordance with some embodiments, the memory cell 300 may be a portion of an anti-fuse memory cell that includes a programming transistor and a reading transistor. The perspective view of FIG. 3A is an overview of the memory cell 300 and thus, some of the features of the memory cell 300 are not identified in FIG. 3. More detailed features of the memory cell 300 will be shown and discussed below with respect to the FIGS. 5 to 17.

The memory cell 300 may be formed on (or include) a substrate 302. Over the substrate 302, the memory cell 300 includes a first gate structure 304 and a second gate structure 314. Each of the first and second gate structures, 304 and 314, is formed as a fin-shaped structure to wrap around the respective channel of a transistor. In some embodiments, the conduction channel may be collectively constituted by one or more semiconductor nanostructures. The gate structure 304 may wrap around nanostructures (or nanostructure channels) 306a, 306b, 306c, and 306d that are spaced from on another (or placed on top of one another) along the Z direction; and the gate structure 314 may wrap around nanostructures (or nanostructure channels) 316a, 316b, 316c, and 316d that are spaced from on another (or placed on top of one another) along the Z direction. On the respective sides of the first gate structure 304, a drain 308 and a source 310 are formed. On the respective sides of the second gate structure 314, a drain 318 and a source 320 are formed.

In some embodiments, a first transistor 350a (e.g., the above-mentioned programming transistor, first transistor 210) may be formed by the gate structure 304, the corresponding wrapped channel (e.g., 306a-d), the drain 308, and the source 310; and a second transistor 350b (e.g., the above-mentioned reading transistor, second transistor 220) may be formed by the gate structure 314, the corresponding wrapped channel (e.g., 316a-d), the drain 318, and the source 320.

Specifically, each of the first and second gate structures, 304 and 314, includes multiple gate stacks. Each of the gate stacks may include one or more gate dielectrics and one or more gate metals. Two of the gate stacks are configured to collectively wrap around a corresponding one of the one or more nanostructures. For instance, the first gate structure 304 includes gate stacks 305a, 305b, 305c, 305d, and 305e. The gate stacks 305a-e may have a substantially similar width (along the Y direction) as the gate structure 304. Additionally, each of the gate stacks 305a-e may include portions that extend along the Z direction to adjoin, connect to, or otherwise merge with an adjacent gate stack. For example, in addition to laterally extending along (e.g., on top of) the nanostructures 306a, the gate stack 305a includes a portion that extends downwardly to be merged with a portion of the adjacent gate stack 305b that extends upwardly.

As such, two adjacent ones of the gate stacks 305a-e can wrap the full perimeter of a corresponding one of the nanostructures 306a-d. The gate stacks 305a and 305b can collectively wrap around at least four sides of the nanostructure 306a, with two sides of the nanostructure 306a respectively coupled to the drain 308 and source 310; the gate stacks 305b and 305c can collectively wrap around at least four sides of the nanostructure 306b, with two sides of the nanostructure 306b respectively coupled to the drain 308 and source 310; gate stacks 305c and 305d can collectively wrap around at least four sides of the nanostructure 306c, with two sides of the nanostructure 306c respectively coupled to the drain 308 and source 310; and gate stacks 305d and 305e can collectively wrap around at least four sides of the nanostructure 306d, with two sides of the nanostructure 306d respectively coupled to the drain 308 and source 310.

Similarly, the second gate structure 314 includes gate stacks 315a, 315b, 315c, 315d, and 315e. The gate stacks 315a-e may have a substantially similar width (along the Y direction) as the gate 314. Additionally, each of the gate stacks 315a-e may include portions that extend along the Z direction to adjoin, connect to, or otherwise merge with an adjacent gate stack. As such, two adjacent ones of the gate stacks 315a-e can wrap the full perimeter of a corresponding one of the nanostructures 316a-d. The gate stacks 315a and 315b can collectively wrap around at least four sides of the nanostructure 316a, with two sides of the nanostructure 316a respectively coupled to the drain 318 and source 320; the gate stacks 315b and 315c can collectively wrap around at least four sides of the nanostructure 316b, with two sides of the nanostructure 316b respectively coupled to the drain 318 and source 320; gate stacks 315c and 315d can collectively wrap around at least four sides of the nanostructure 316c, with two sides of the nanostructure 316c respectively coupled to the drain 318 and source 320; and gate stacks 315d and 315e can collectively wrap around at least four sides of the nanostructure 316d, with two sides of the nanostructure 316d respectively coupled to the drain 318 and source 320.

Figure 3B:
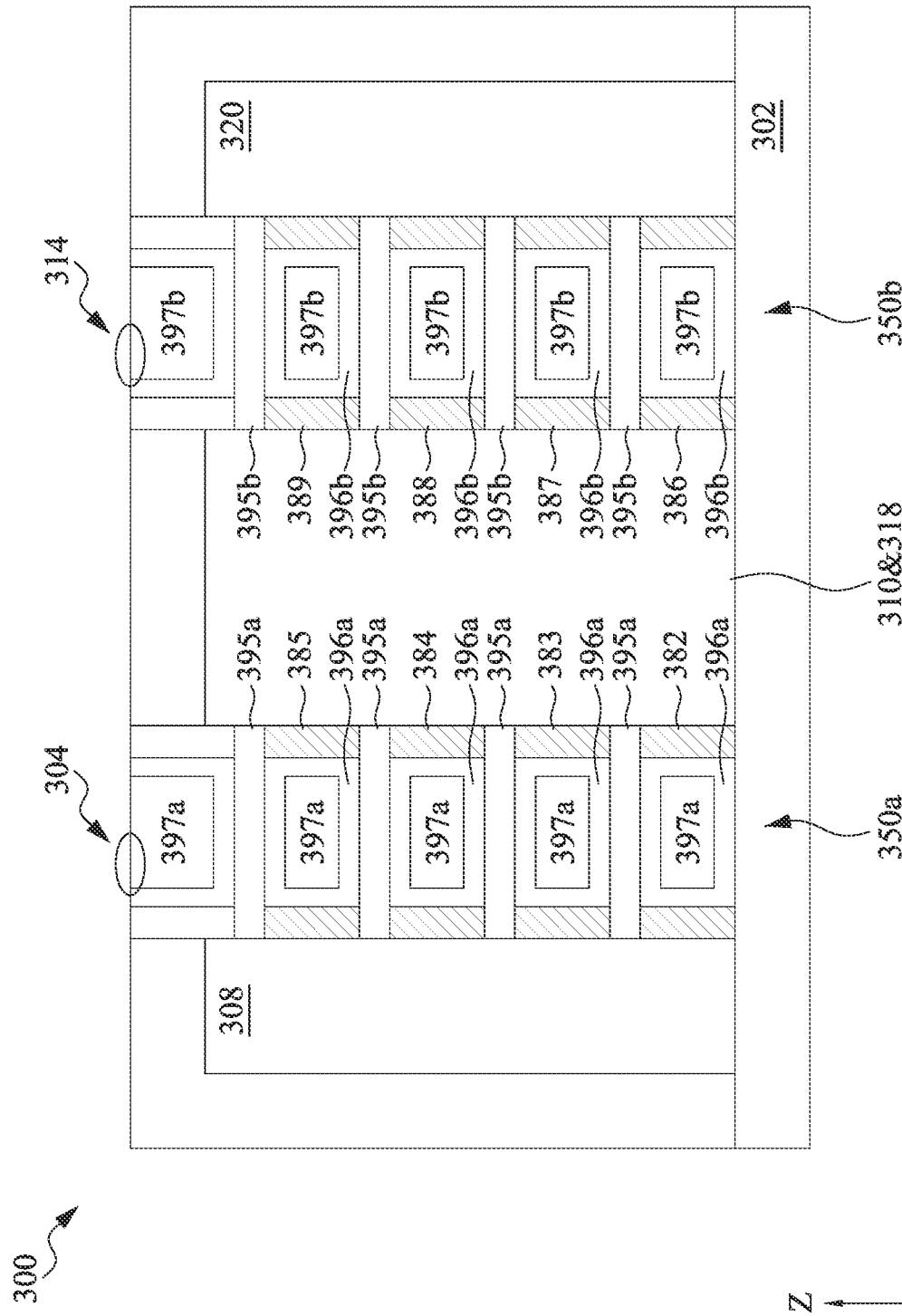
FIG. 3B illustrates a cross-sectional view of the memory cell of FIG. 3A, cut along line A-A', in accordance with some embodiments.

FIG. 3B illustrates a cross-sectional view of the memory cell 300 including programming transistor 350a and reading transistor 350b, cut along line A-A' (FIG. 3A), in accordance with some embodiments. As mentioned above, the conduction channel of the programming transistor 350a can be constituted by the nanostructures 306a-d, which are collectively referred to as conduction channel 395a hereafter; and the conduction channel of the reading transistor 350b can be constituted by the nanostructures 316a-d, which are collectively referred to as conduction channel 395b hereafter. As further shown in FIG. 3B, the gate structure of the programming transistor 350a (304) includes gate metal 397a and gate dielectric 396a; and the gate structure of the reading transistor 350b (314) includes gate metal 397b and gate dielectric 396b.

For the sake of simplicity and clarity, other features have not been labeled and/or are not described with respect to FIG. 3B but will be described below with respect to FIGS. 5-17. Furthermore, although not shown, the gate 397a is connected to a programming word line (e.g., WLP 230) and the gate 397b is connected to a reading word line (e.g., WLR 232). Furthermore, although FIG. 3B is described with the programming and reading transistors 350a and 350b being two NMOS (or PNMOS) transistors, embodiments are not limited thereto, and the programming and reading transistors 350a and 350b can be PMOS (or NPMOS) transistors as shown and described with references to memory cell 250 of FIG. 2B. Accordingly, repeated descriptions are omitted for brevity.

Generally, for NMOS transistors (configured in an enhancement-mode), the source and drain are typically doped to N+, and the channel region is typically doped to P. When a voltage that is greater than a threshold voltage of the transistor is applied to the channel region through the gate, a conduction channel is formed (e.g., inverted) in the channel region between the source and drain. Such an inverted conduction channel in the enhancement-mode NMOS transistor is sometimes referred to as an n-channel. Upon the conduction channel being formed, a p-n junction is formed between the source and the channel region and between the drain and the channel region. Both the source and drain are typically connected to other devices so that a current flows through the source, channel, and drain.

In some embodiments, in the memory cell 300, which includes an anti-fuse memory cell, the drain 308 is floating (i.e., not electrically connected to any other functioning features). Therefore, when the gate 397a receives a voltage equal to or greater than the threshold voltage, there is no current that flows through the drain 308. Thus, a p-n junction may not be necessary between the drain 308 and the conduction channel 395a. Accordingly, the drain 308 can be doped to P or P+, which is opposite to the doping type of other sources/drains, 310, 318, and 320. As another example, the P-type doping concentration in the drain 308 can be substantially similar to the conduction channel 395a such that there is no p-n junction between the drain 308 and the conduction channel 395a.

In some embodiments, there can be a gradient in doping of the conduction channel 395a such that a left edge of the conduction channel 395a (i.e., edge closer to the drain 308) has the most p-type doping and a right edge of the conduction channel 395a (i.e., edge closer to the source 310) has the least p-type doping. In some embodiments, the left edge can have 1% to 99% of the p-type doping that is present in the drain 308. For example, if the drain 308 is doped to a concentration level of about $10^{-14}$ cm$^{-3}$, a region of the conduction channel 395a to the right of the drain 308 can be doped to a concentration level of about $10^{-15}$ cm$^{-3}$, which is about 10% of the doping concentration of the drain 308. These values are provided for illustration purposes only, and the doping concentration levels and/or percentages can be greater or less than the values provided herein.

Figure 4:
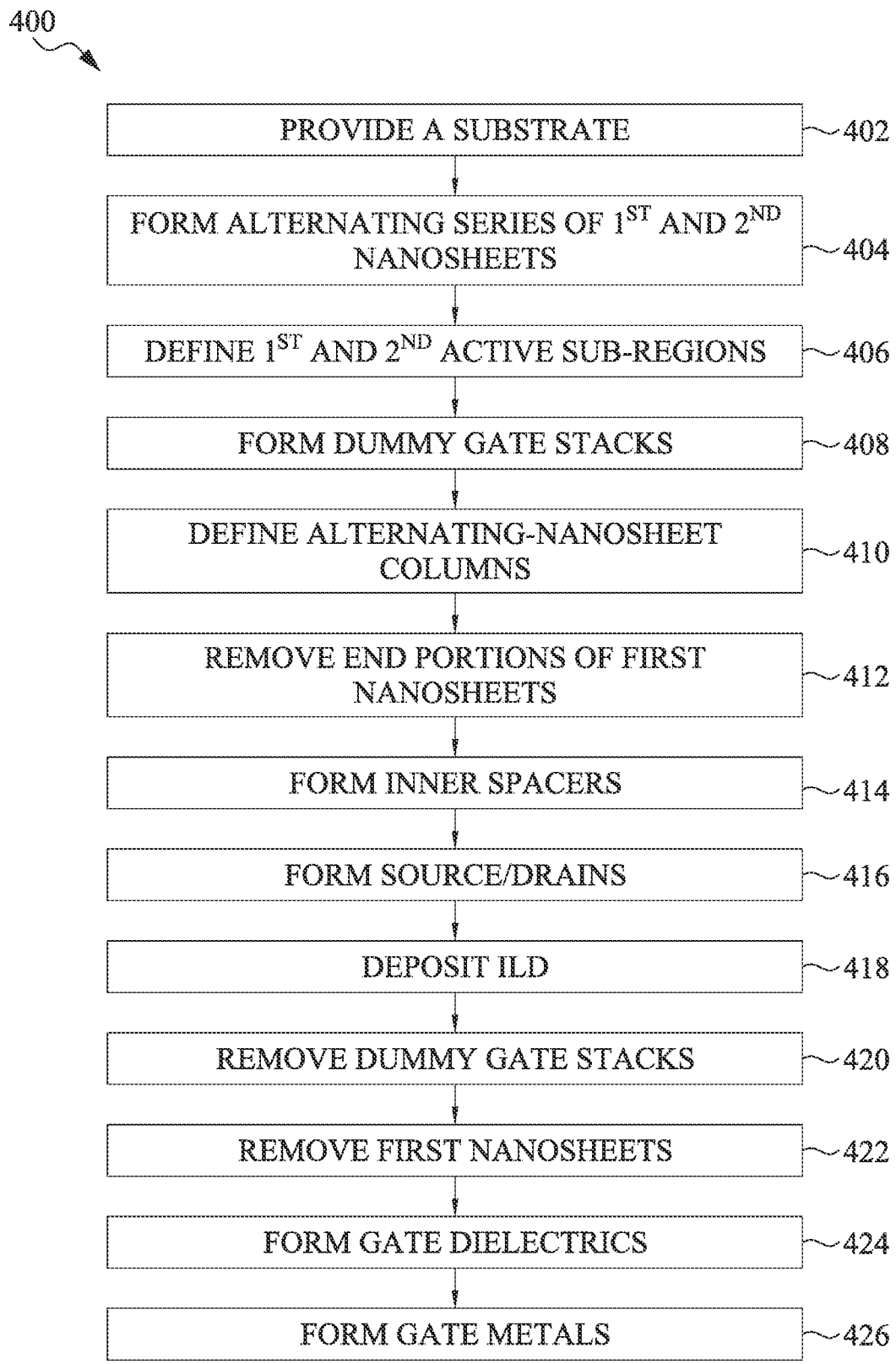
FIG. 4 illustrates a flowchart of an example process of forming a memory device, according to some embodiments.

FIG. 4 illustrates a flowchart of a method 400 to form a memory device, according to one or more embodiments of the present disclosure. The method 400 may be used to form an anti-fuse memory cell, including a programming transistor and a reading transistor, coupled in series. For example, at least some of the operations described in the method 400 may be used to form the memory cell 300 (FIGS. 3A-B). It is noted that the method 400 is merely an example and is not intended to limit the present disclosure. Accordingly, it is understood that additional operations may be provided before, during, and after the method 400 of FIG. 4, and that some other operations may only be briefly described herein.

The operations of the method 400 may be associated with cross-sectional views of the memory cell 300, cut along line A-A', at respective fabrication stages as shown in FIGS. 5-17. In some embodiments, the memory cell 300 may be included in or otherwise coupled to a microprocessor, another memory device, and/or other IC. Also, FIGS. 5-17 are simplified for a better understanding of the concepts of the present disclosure. Although the figures illustrate the memory cell 300, it is understood the IC may include a number of other devices such as inductors, resistor, capacitors, transistors, etc., which are not shown in FIGS. 5-17, for purposes of clarity of illustration.

In brief overview, the method 400 starts with operation 402 in which a substrate is provided. The method 400 proceeds to operation 404 in which an alternating series of first nanostructures and second nanostructures are formed. The method 400 proceeds to operation 406 in which an active region (including a first active sub-region and second active sub-region) is defined. The method 400 proceeds to operation 408 in which a number of dummy gate stacks are formed. The method 400 proceeds to operation 410 in which a number of alternating-nanostructure columns are defined. The method 400 proceeds to operation 412 in which respective end portions of the first nanostructures are removed. The method 400 proceeds to operation 414 in which inner spacers are formed. The method 400 proceeds to operation 416 in which sources and drains are formed. The method 400 proceeds to operation 418 in which an inter-layer dielectric is deposited. The method 400 proceeds to operation 420 in which the dummy gate stacks are removed. The method 400 proceeds to operation 422 in which the first nanostructures are removed. The method 400 proceeds to operation 424 in which gate dielectrics are formed. The method 400 proceeds to operation 426 in which gate metals are formed.

Figure 5:
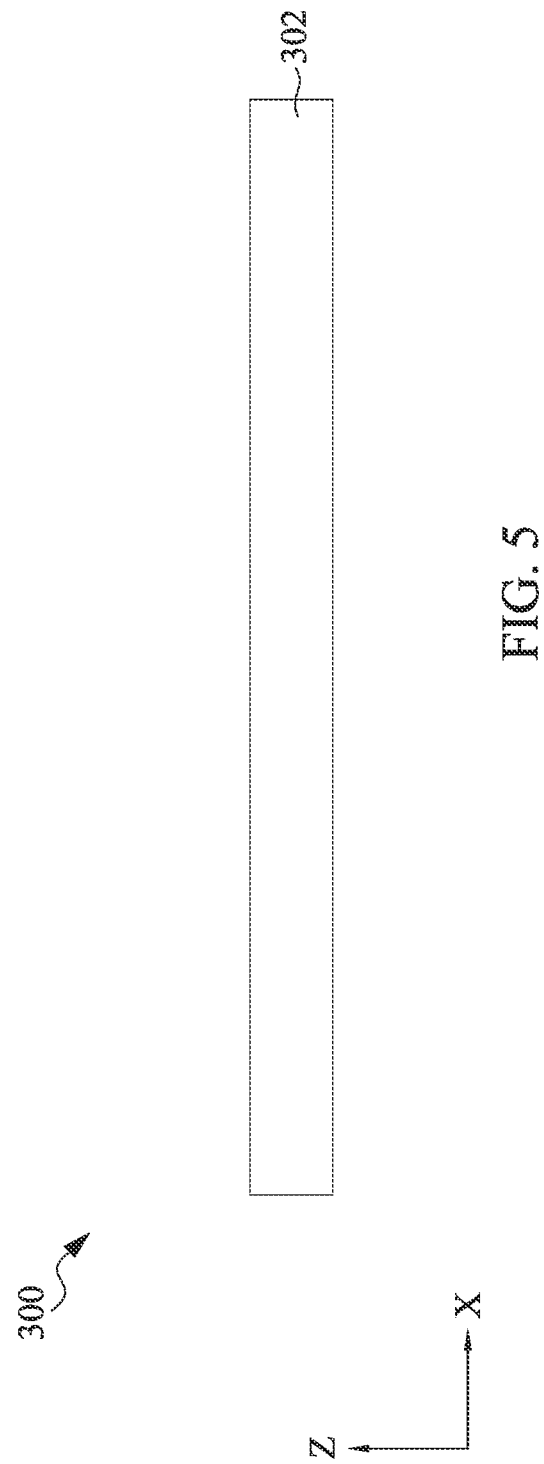
FIGS. 5, 6, 7, 8, 9, 10, 11, 12, 13, 14, 15, 16, and 17 illustrate cross-sectional views of the memory cell of FIG. 3B in accordance with some embodiments.

Corresponding to operation 402, FIG. 5 is a cross-sectional view of the memory cell 300, cut along line A-A' (FIG. 3A), that includes the substrate 302, at one of the various stages of fabrication.

The substrate 302 includes a semiconductor material substrate, for example, silicon. Alternatively, the substrate 302 may include other elementary semiconductor material such as, for example, germanium. The substrate 302 may also include a compound semiconductor such as silicon carbide, gallium arsenic, indium arsenide, and indium phosphide. The substrate 302 may include an alloy semiconductor such as silicon germanium, silicon germanium carbide, gallium arsenic phosphide, and gallium indium phosphide. In one embodiment, the substrate 302 includes an epitaxial layer. For example, the substrate may have an epitaxial layer overlying a bulk semiconductor. Furthermore, the substrate 302 may include a semiconductor-on-insulator (SOI) structure. For example, the substrate 302 may include a buried oxide (BOX) layer formed by a process such as separation by implanted oxygen (SIMOX) or other suitable technique, such as wafer bonding and grinding.

Figure 6:
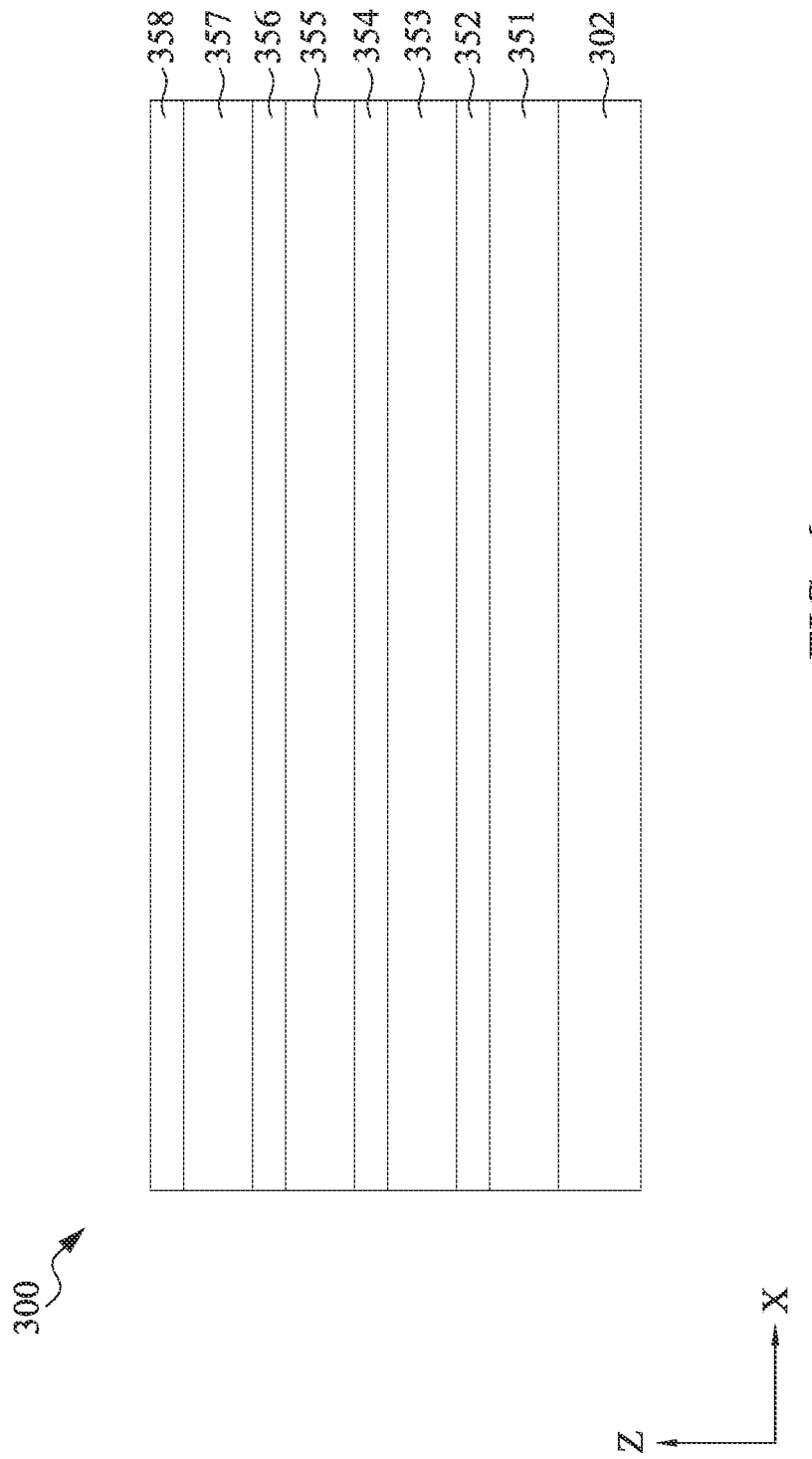

Corresponding to operation 404, FIG. 6 is a cross-sectional view of the memory cell 300, cut along line A-A' (FIG. 3A), that includes an alternating series of first nanostructures 351, 353, 355, and 357 and second nanostructures 352, 354, 356, and 358, at one of the various stages of fabrication.

The first nanostructures 351, 353, 355, and 357 may include SiGe sacrificial nanostructures (hereinafter "SiGe sacrificial nanostructures 351, 353, 355, and 357"), and the second nanostructures 352, 354, 356, and 358 may include Si nanostructures (hereinafter "Si nanostructures 352, 354, 356, and 358"). The alternating series of SiGe sacrificial nanostructures 351, 353, 355, and 357, and the Si nanostructures 352, 354, 356, and 358 may be formed as a stack over the substrate 302. Such a stack may sometimes be referred to as a superlattice.

In a non-limiting example, the SiGe sacrificial nanostructures 351, 353, 355, and 357 can be SiGe 25%. The notation "SiGe 25%" is used to indicate that 25% of the SiGe material is Ge. It is understood the percentage of Ge in each of the SiGe sacrificial nanostructures 351, 353, 355, and 357 can be any value between 0 and 100 (excluding 0 and 100), while remaining within the scope of the present disclosure. In some other embodiments, the nanostructures 352, 354, 356, and 358 may include a first semiconductor material other than Si and the nanostructures 351, 353, 355, and 357 may include a second semiconductor material other than SiGe, as long as the first and second semiconductor materials are respectively characterized with different etching properties (e.g., etching rates). The alternating series of nanostructures can be formed by epitaxially growing one layer and then the next until the desired number and desired thicknesses of the nanostructures are achieved.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. For example, when forming the programming transistor and reading transistor of the memory cell 300 that each function as part of an enhancement-mode NMOS (e.g., FIGS. 3A-B), the Si nanostructures 352, 354, 356, and 358 may be each doped with p-type dopants. In another example, when forming the programming transistor and reading transistor of the memory cell 300 that each function as part of an enhancement-mode PMOS, the Si nanostructures 352, 354, 356, and 358 may be each doped with n-type dopants. In yet another example, when forming the programming transistor and reading transistor of the memory cell 300 that each function as part of a depletion-mode NMOS, the Si nanostructures 352, 354, 356, and 358 may be each doped with n-type dopants. In yet another example, when forming the programming transistor and reading transistor of the memory cell 300 that each function as part of a depletion-mode PMOS, the Si nanostructures 352, 354, 356, and 358 may be each doped with p-type dopants.

Figure 7:
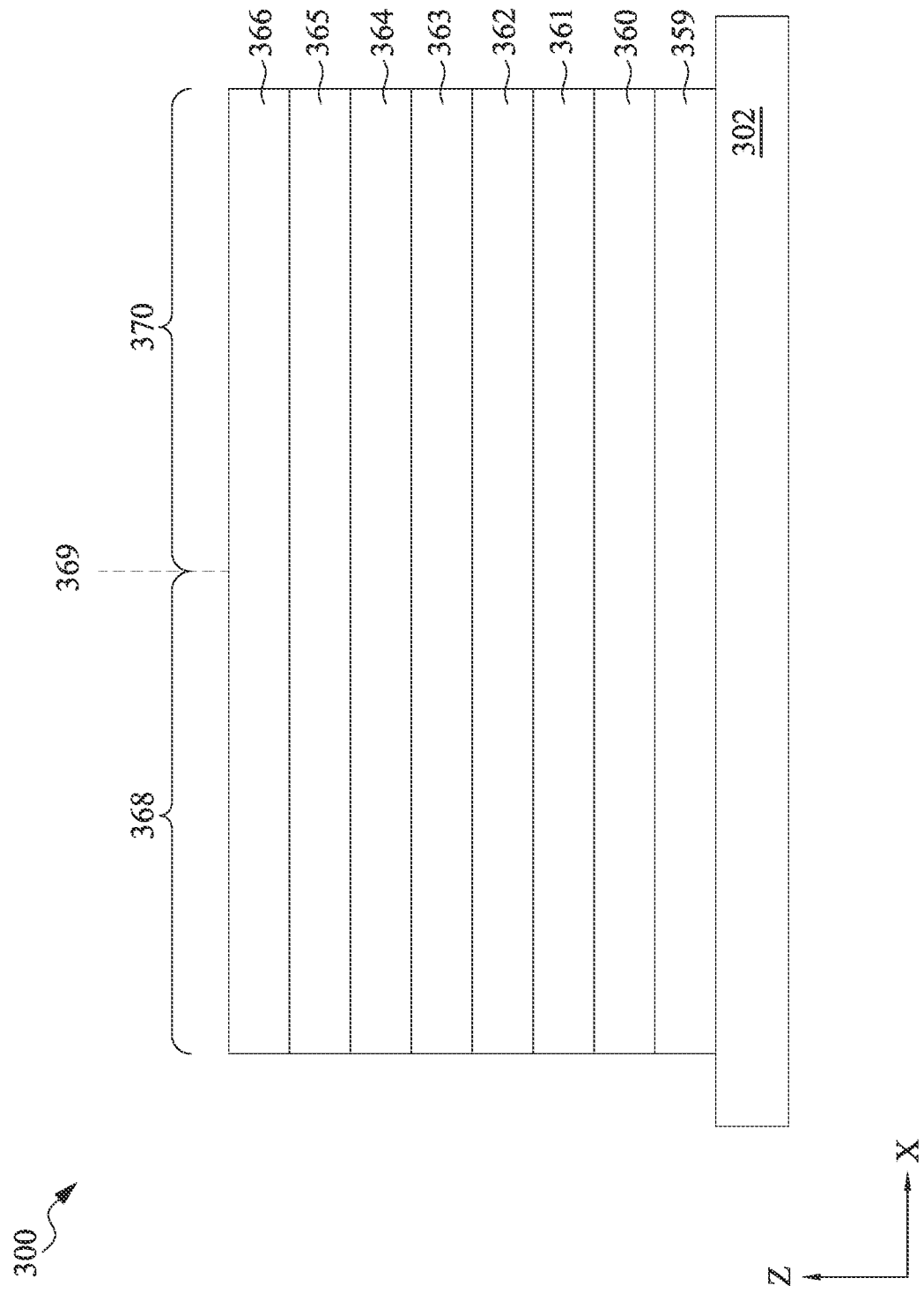

Corresponding to operation 406, FIG. 7 is a cross-sectional view of the memory cell 300, cut along line A-A' (FIG. 3A), that includes defined active sub-regions 368 and 370, at one of the various stages of fabrication.

The nanostructures 351-358 may then be etched using the mask to form the active sub-regions 368 and 370. Referring again to FIG. 7, the "etched" SiGe nanostructure 359, Si nanostructure 360, SiGe nanostructure 361, Si nanostructure 362, SiGe nanostructure 363, Si nanostructure 364, SiGe nanostructure 365, and Si nanostructure 366, stacked on top of one another along the Z direction, may collectively constitute the active sub-regions 368 and 370. As such, a symbolic boundary (as indicated by dotted line 369 in FIG. 7) may be defined to differentiate the active sub-regions 368 and 370.

Figure 8:
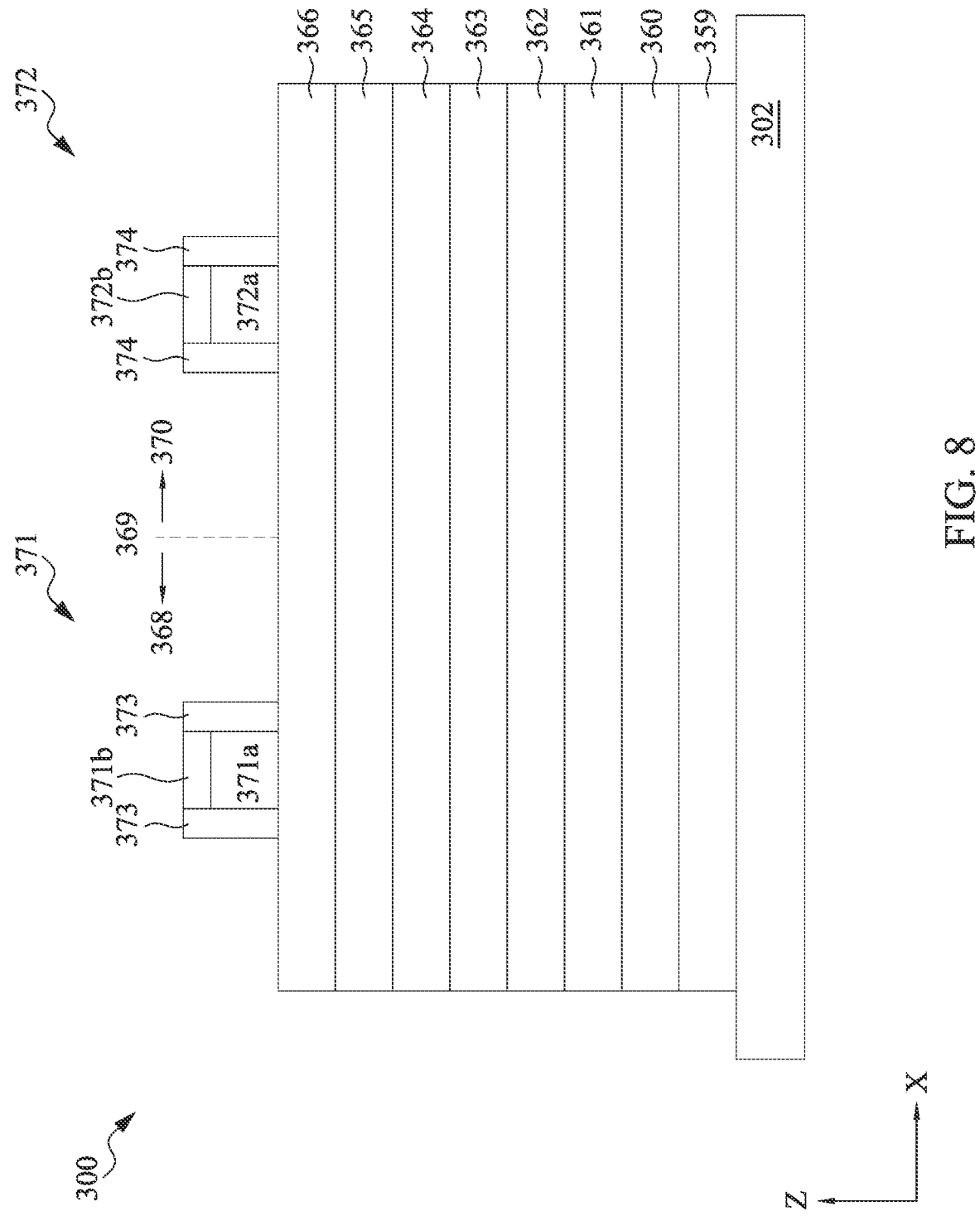

Corresponding to operation 408, FIG. 8 is a cross-sectional view of the memory cell 300, cut along line A-A' (FIG. 3A), that includes a first dummy gate stack 371 and second dummy gate stack 372, at one of the various stages of fabrication.

Each of the dummy gate stacks, 371 and 372, includes a dummy gate and a hard mask. For example in FIG. 8, the first dummy gate stack 371 includes a dummy gate 371a formed over the Si nanostructure 366, and a hard mask 371b formed over the dummy gate 371a; and the second dummy gate stack 372 includes a dummy gate 372a formed over the Si nanostructure 366, and a hard mask 372b formed over the dummy gate 372a.

As such, the dummy gate stacks 371 and 372, extending along the Y direction, may be formed over the active sub-regions 368 and 370, respectively. Specifically, the dummy gate stack 371 may be formed over and around sidewalls of the active sub-region 368, and the dummy gate 372 may be formed over and around sidewalls of the active sub-region 370. The dummy gates 371a and 372a can be formed by depositing amorphous silicon (a-Si) over and around the active sub-regions 368 and 370. Other materials suitable for forming dummy gates (e.g., polysilicon) can be used while remaining within the scope of the present disclosure. The a-Si is then planarized to a desired level. A hard mask (not shown) is deposited over the planarized a-Si and patterned to form the hard masks 371b and 372b. The hard masks 371b and 372b can be formed from a nitride or an oxide layer. An etching process (e.g., a reactive-ion etching (ME) process) is applied to the a-Si to form the dummy gate stacks 371 and 372.

After forming the dummy gate stacks 371 and 372, offset gate spacers 373 and 374 may be formed to extend along respective sidewalls of the dummy gate stacks 371 and 372, as illustrated in FIG. 8. The offset gate spacers 373 and 374 can be formed using a spacer pull down formation process. The offset gate spacers 373 and 374 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., ME).

Figure 9:
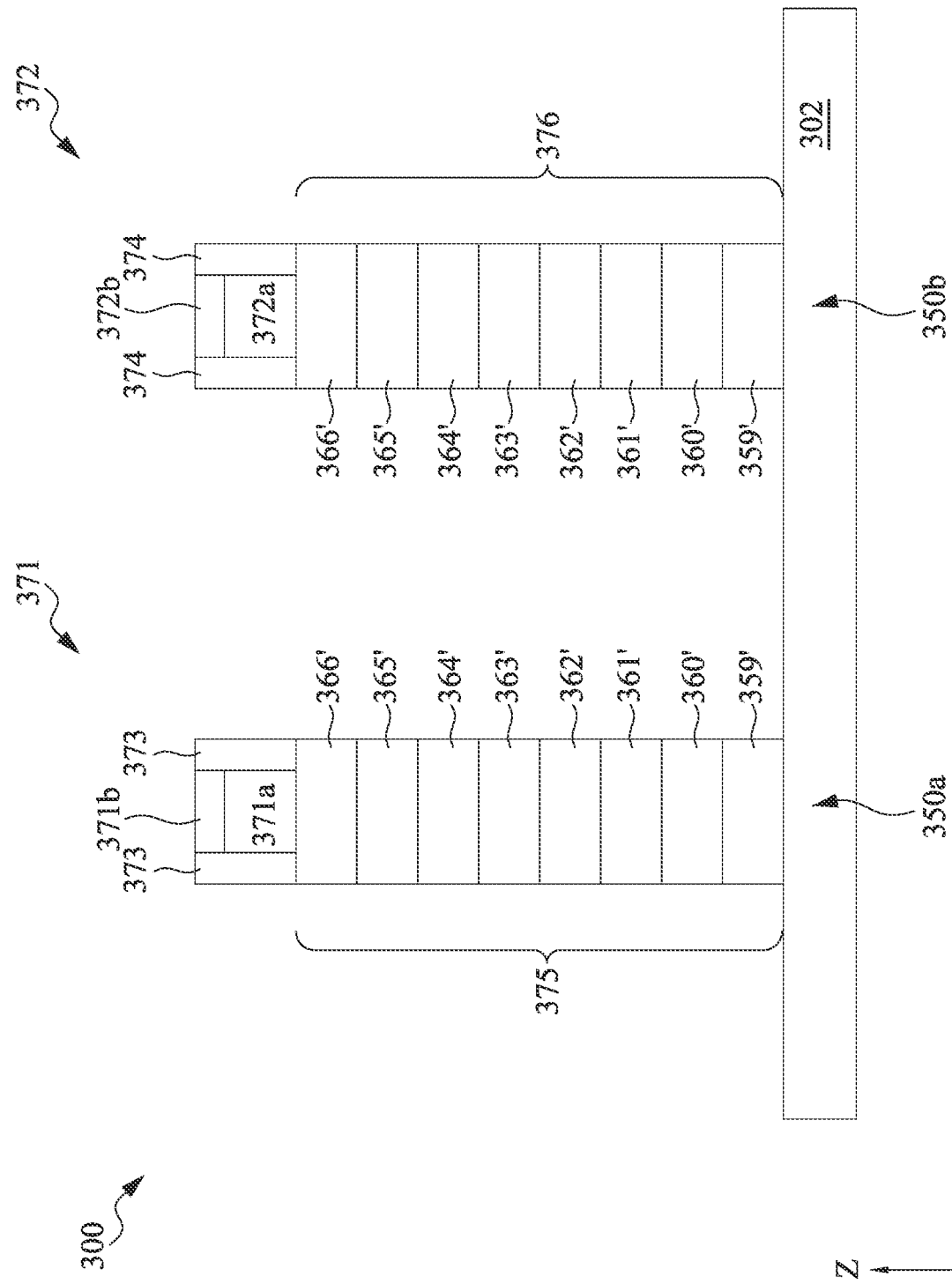

Corresponding to operation 410, FIG. 9 is a cross-sectional view of the memory cell 300, cut along line A-A' (FIG. 3A), that includes alternating-nanostructure columns 375 and 376, at one of the various stages of fabrication.

Subsequently to forming the offset gate spacers 373 and 374, the alternating-nanostructure columns 375 and 376 may be formed from the active sub-regions 368 and 370, respectively. In the formation of the alternating-nanostructure columns 375 and 376, the offset gate spacers 373 and 374, the dummy gates 371a and 372a, and the hard masks 371b and 372b can be used as a mask to define the footprint of the alternating-nanostructure columns 375 and 376, and an etching process can be applied to the active sub-regions 368 and 370 to form the alternating-nanostructure columns 375 and 376.

As illustrated in FIG. 9, the alternating-nanostructure column 375 is overlaid by the dummy gate stack 371 and the offset gate spacer 373; and the alternating-nanostructure column 376 is overlaid by the dummy gate stack 372 and the offset gate spacer 374. The alternating-nanostructure column 375 is positioned in a region of the substrate 302 where the programming transistor 350a (shown in FIG. 3A) will be formed, and the alternating-nanostructure column 376 is positioned in a region of the substrate 302 where the reading transistor 350b (shown in FIG. 3A) will be formed. Each of the alternating-nanostructure columns 375 and 376 includes a stack of alternating "defined" SiGe/Si nanostructures. For example, each of the alternating-nanostructure columns 375 and 376 includes a stack of alternating defined SiGe nanostructure 359', defined Si nanostructure 360', defined SiGe nanostructure 361', defined Si nanostructure 362', defined SiGe nanostructure 363', defined Si nanostructure 364', defined SiGe nanostructure 365', and defined Si nanostructure 366'.

In some embodiments, when no extended source/drain junctions are formed, the defined Si nanostructures 360', 362', 364', and 366' of the alternating-nanostructure column 375 may correspond to the nanostructures 306d, 306c, 306b, and 306a (shown in FIG. 3A), respectively; and the defined Si nanostructures 360', 362', 364', and 366' of the alternating-nanostructure column 376 may correspond to the nanostructures 316d, 316c, 316b, and 316a (shown in FIG. 3A), respectively.

Figure 10:
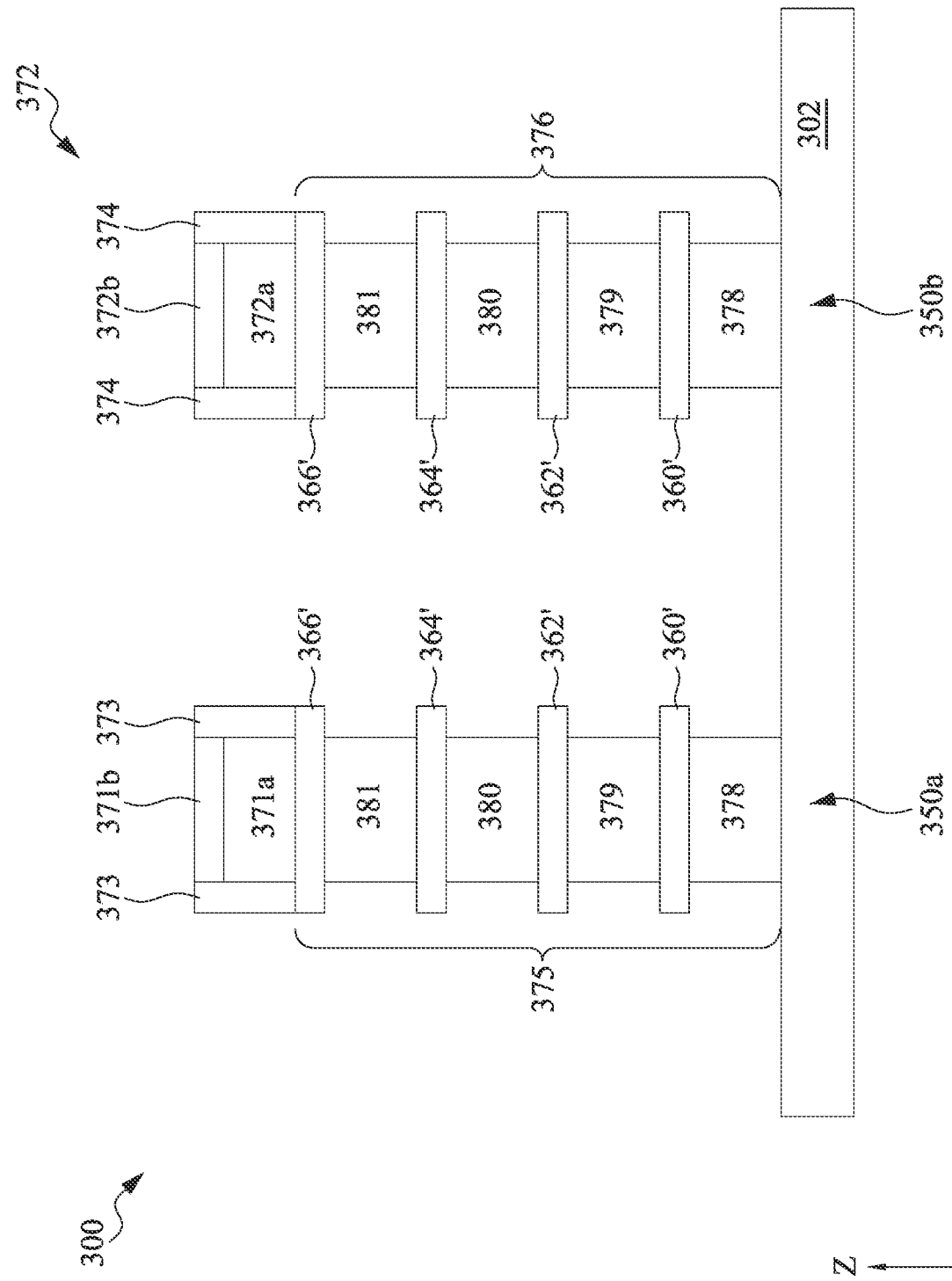

Corresponding to operation 412, FIG. 10 is a cross-sectional view of the memory cell 300, cut along line A-A' (FIG. 3A), in which respective end portions of each of the defined SiGe nanostructure 359', defined SiGe nanostructure 361', defined SiGe nanostructure 363', and defined SiGe nanostructure 365' are removed, at one of the various stages of fabrication.

As such, etched SiGe sacrificial nanostructures 378, 379, 380, and 381 can be formed. In some embodiments of present disclosure, the end portions of the defined SiGe nanostructures 359', 361', 363', and 365' can be removed using a first application, so called a "pull-back" process to pull the defined SiGe nanostructures 359', 361', 363', and 365' back an initial pull-back distance such that the ends of the etched SiGe sacrificial nanostructures 378, 379, 380, and 381 terminate underneath the offset gate spacers 373 and 374. The pull-back process may include a hydrogen chloride (HCL) gas isotropic etch process, which etches SiGe without attacking Si.

Figure 11:
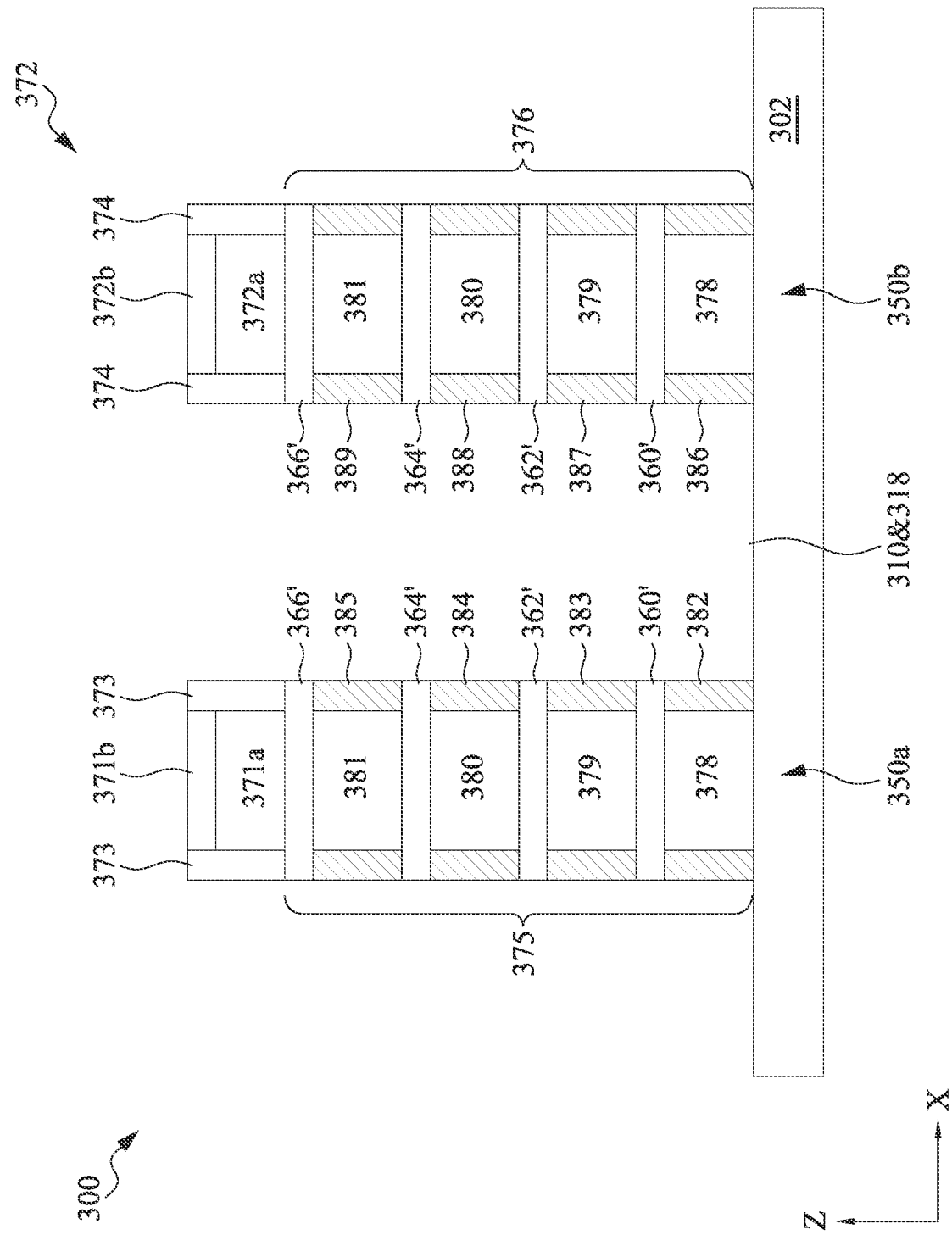

Corresponding to operation 414, FIG. 11 is a cross-sectional view of the memory cell 300, cut along line A-A' (FIG. 3A), that includes inner spacers 382, 383, 384, 385, 386, 387, 388, and 389, at one of the various stages of fabrication.

In some embodiments, the inner spacers 382-389 can be formed conformally by chemical vapor deposition (CVD), or by monolayer doping (MLD) of nitride followed by spacer ME. In some other embodiments, the inner spacers 382-389 can be deposited using, e.g., a conformal deposition process and subsequent isotropic or anisotropic etch back to remove excess spacer material on vertical sidewalls of the alternating-nanostructure columns 375 and 376 and on a surface of the semiconductor substrate 302. A material of the inner spacers 382-389 can be formed from the same or different material as the offset gate spacers 373 and 374 (e.g., silicon nitride). For example, the inner spacers 382-389 can be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of FET devices.

Figure 12:
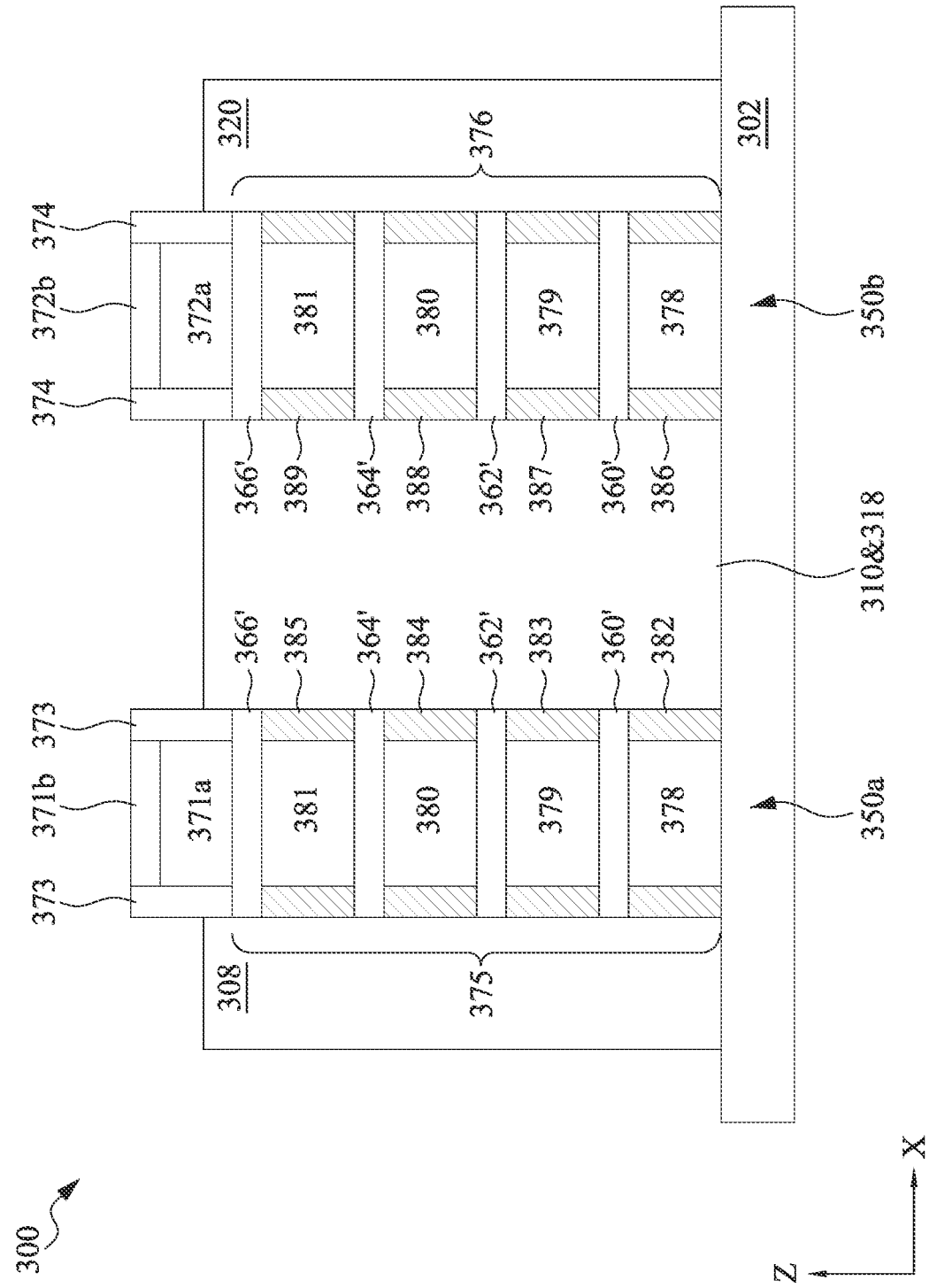

Corresponding to operation 416, FIG. 12 is a cross-sectional view of the memory cell 300, cut along line A-A' (FIG. 3A), that includes the drain 308, the source 310, the drain 318, and the source 320, at one of the various stages of fabrication.

In some embodiments of the present disclosure, the drain 308 may be formed using an epitaxial layer growth process on the exposed ends of the defined Si nanostructures 360', 362', 364', and 366' of the alternating-nanostructure column 375 in a region of the substrate 302 on the left-hand side of the dummy gate stack 371. The source 310 may be formed using an epitaxial layer growth process on the exposed ends of the defined Si nanostructures 360', 362', 364', and 366' of the alternating-nanostructure column 375 in a region of the substrate 302 on the right-hand side of the dummy gate stack 371. The drain 318 may be formed using an epitaxial layer growth process on the exposed ends of the defined Si nanostructures 360', 362', 364', and 366' of the alternating-nanostructure column 376 in a region of the substrate 302 on the left-hand side of the dummy gate stack 372. The source 320 is formed using an epitaxial layer growth process on the exposed ends of the defined Si nanostructures 360', 362', 364', and 366' in a region of the substrate 302 on the right-hand side of the dummy gate stack 372.

In some embodiments, the drain 308 and source 310 may be formed to follow a shape of the active sub-region 368, and the drain 318 and source 320 may be formed to follow a shape of the active sub-region 370. Further, the source 310 and drain 318 may merge together.

In-situ doping (ISD) may be applied to form doped drains/sources 308, 310, 318, and 320, thereby creating the necessary junctions for the programming transistor 350a and reading transistor 350b. N-type FETs (NMOS) and p-type FETs (PMOS) are formed by implanting different types of dopants to selected regions (e.g., drains/sources 308, 310, 318, and 320) of the device to form the necessary junction(s). N-type devices can be formed by implanting arsenic (As) or phosphorous (P), and p-type devices can be formed by implanting boron (B).

In some embodiments, the drain 308 can be doped with a type that is different than the doping type of the source 310, drain 318, and source 320. For example, if the source 310, drain 318, and source 320 are doped with n-type dopants, the drain 308 can be doped with p-type dopants. As another example, if the source 310, drain 318, and source 320 are doped with p-type dopants, the drain 308 can be doped with n-type dopants.

In some embodiments, there may be a gradient in the doping concentration of the defined Si nanostructures 360', 362', 364', and 366'. For example, the drain 308 can be epitaxially grown and annealed at an elevated temperature. During the annealing process, a left portion of the defined Si nanostructures 360', 362', 364', and 366' (e.g., the portion abutting the drain 308) can increase in doping concentration with more p-type dopants, whereas the right portion of the defined Si nanostructures 360', 362', 364', and 366' (e.g., the portion abutting the source 310) is not doped further. As such, a gradient in the doping concentration can be present along each of the defined Si nanostructures 360', 362', 364', and 366'. In some embodiments, a ratio of the left portion with a higher doping concentration (e.g., higher than the original doping concentration of the Si nanostructures 352-358 as discussed in FIG. 6) to the right portion with a lower doping concentration (e.g., equal to the original doping concentration of the Si nanostructures 352-358 as discussed in FIG. 6) may be present. Such a ratio may be characterized with respective lengths of the left and right portions (extending along the X direction). The ratio may be adjusted as any value greater than 0 and less than 1 by controlling various fabrication parameters (e.g., an annealing temperature, an annealing time, a doping concentration of the drain 308). For example, the ratio may be around 1 (i.e., the left and right portions being about equal). In another example, the ratio may be less than 1 (i.e., the left being less or shorter than the right portion). In yet another example, the ratio may be greater than 1 (i.e., the left being more or longer than the right portion).

Similarly, when the transistor 350a includes an NPMOS transistor (e.g., n-type drain/p-type source MOS transistor), the drain 308 may be epitaxially grown and then annealed. During the annealing process, a portion of defined Si nanostructures 360', 362', 364', and 366' (e.g., the portion abutting the drain 308) can increase in doping concentration with more n-type dopants, whereas the right portion of the defined Si nanostructures 360', 362', 364', and 366' (e.g., the portion abutting the source 310) is not doped further. Because the drain 308 has p-type doping, the p-n junction between the drain 308 and the defined Si nanostructures 360', 362', 364', and 366' disappears. Accordingly, a gradient in doping concentration going from more doping in the left portion to less doping in the right portion.

Figure 13:
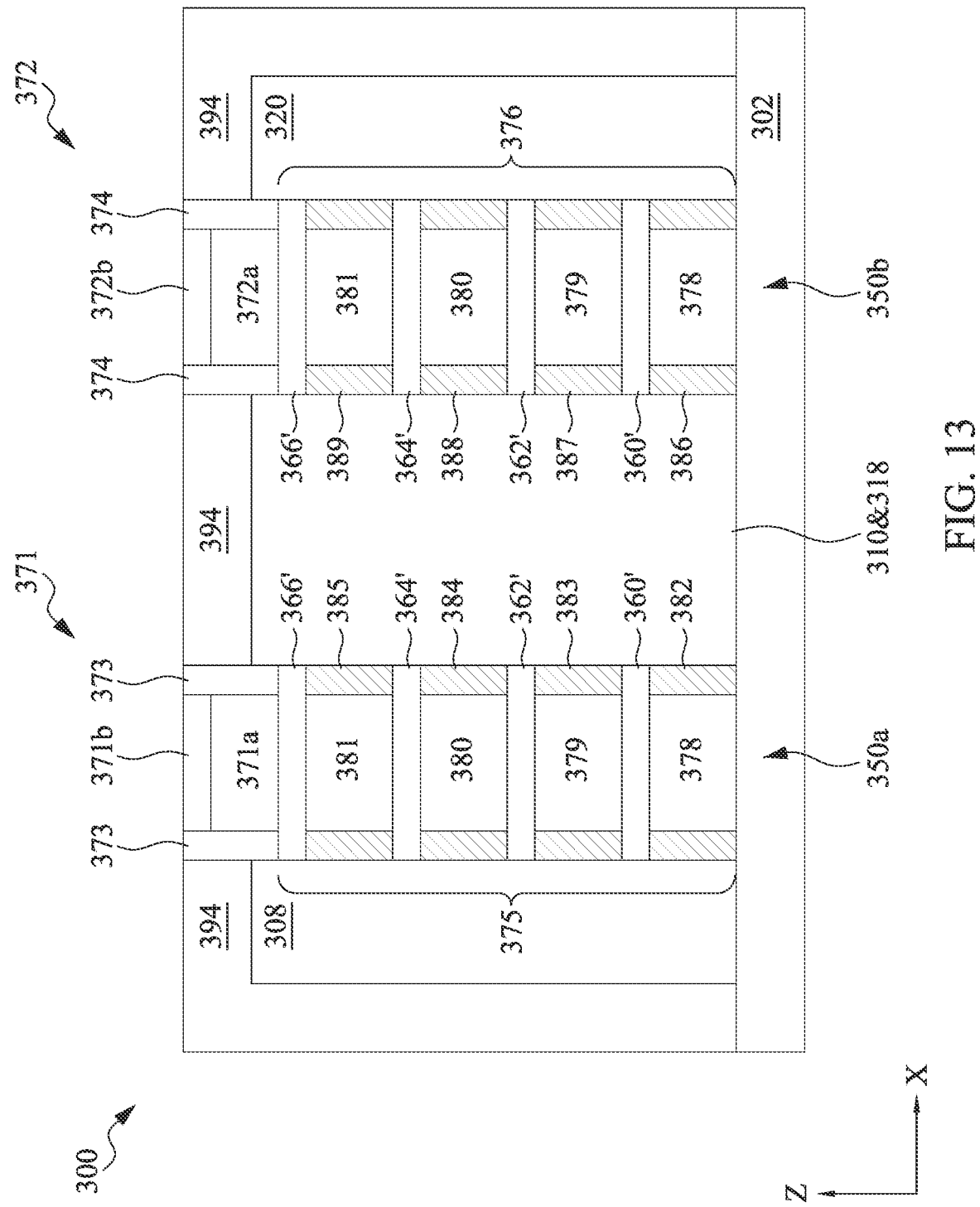

Corresponding to operation 418, FIG. 13 is a cross-sectional view of the memory cell 300, cut along line A-A' (FIG. 3A), that includes an inter-layer dielectric (ILD) material 394, at one of the various stages of fabrication. The ILD material 394 can be formed by depositing an oxide material in bulk (e.g., silicon dioxide) and polishing the bulk oxide back (e.g., using CMP) to the level of the offset gate spacers 373 and 374 and the hard masks 371b and 372b.

Figure 14:
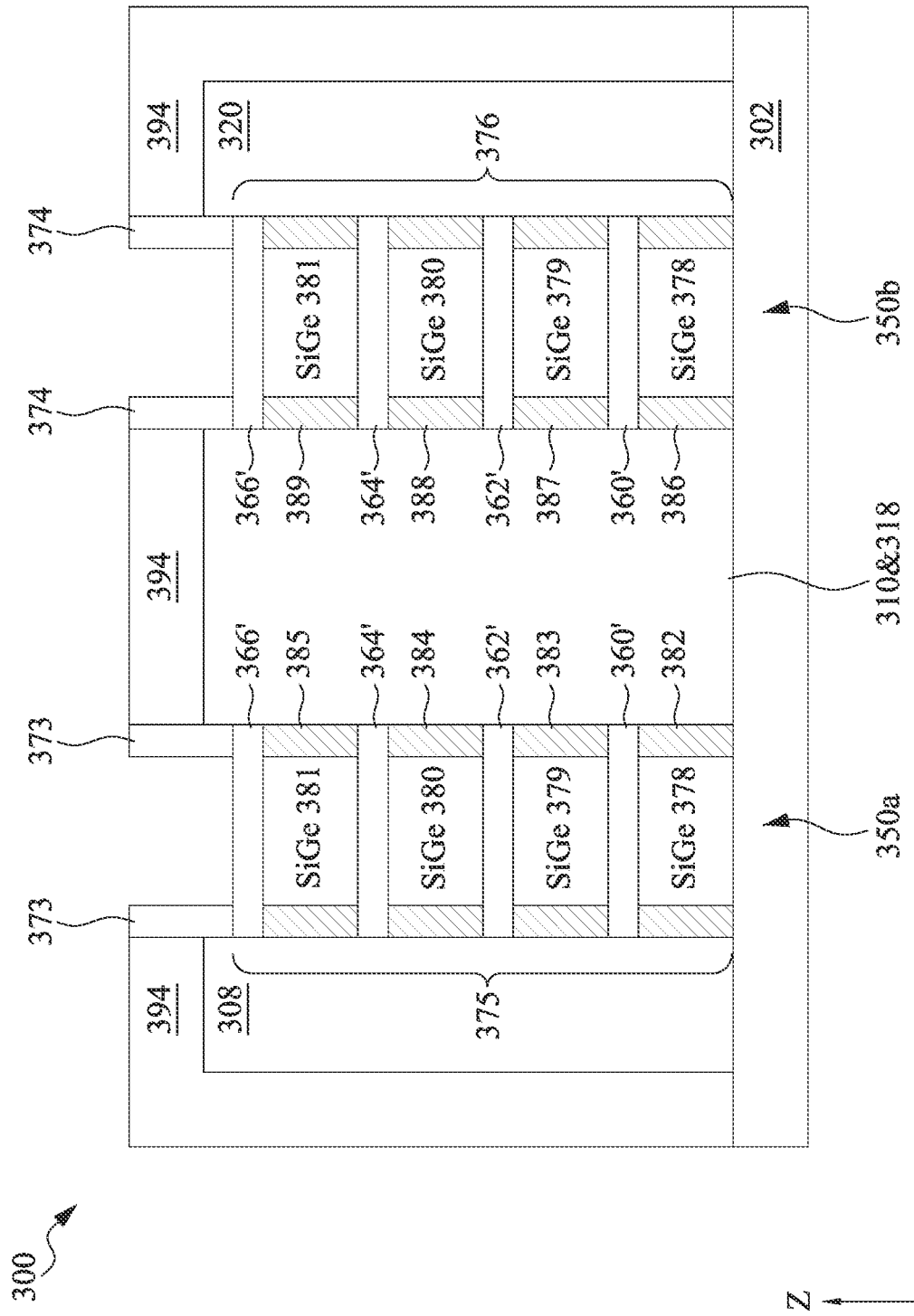

Corresponding to operation 420, FIG. 14 is a cross-sectional view of the memory cell 300, cut along line A-A' (FIG. 3A), in which the dummy gate stacks 371 and 372 (FIG. 13) are removed, at one of the various stages of fabrication. Subsequently to forming the protective ILD material 394, the dummy gate stacks 371 (including the dummy gate 371a and hard mask 371b) and 372 (including the dummy gate 372a and hard mask 372b), as illustrated in FIG. 13, are removed. The dummy gate stacks 371 and 372 can be removed by a known etching process, e.g., RIE or chemical oxide removal (COR).

After the removal of the dummy gate stacks 371 and 372, respective top boundaries of the alternating-nanostructure columns 375 and 376 may be again exposed. Specifically, respective top boundaries of the defined Si nanostructures 366' of the alternating-nanostructure columns 375 and 376 may be exposed, as shown in FIG. 14.

Figure 15:
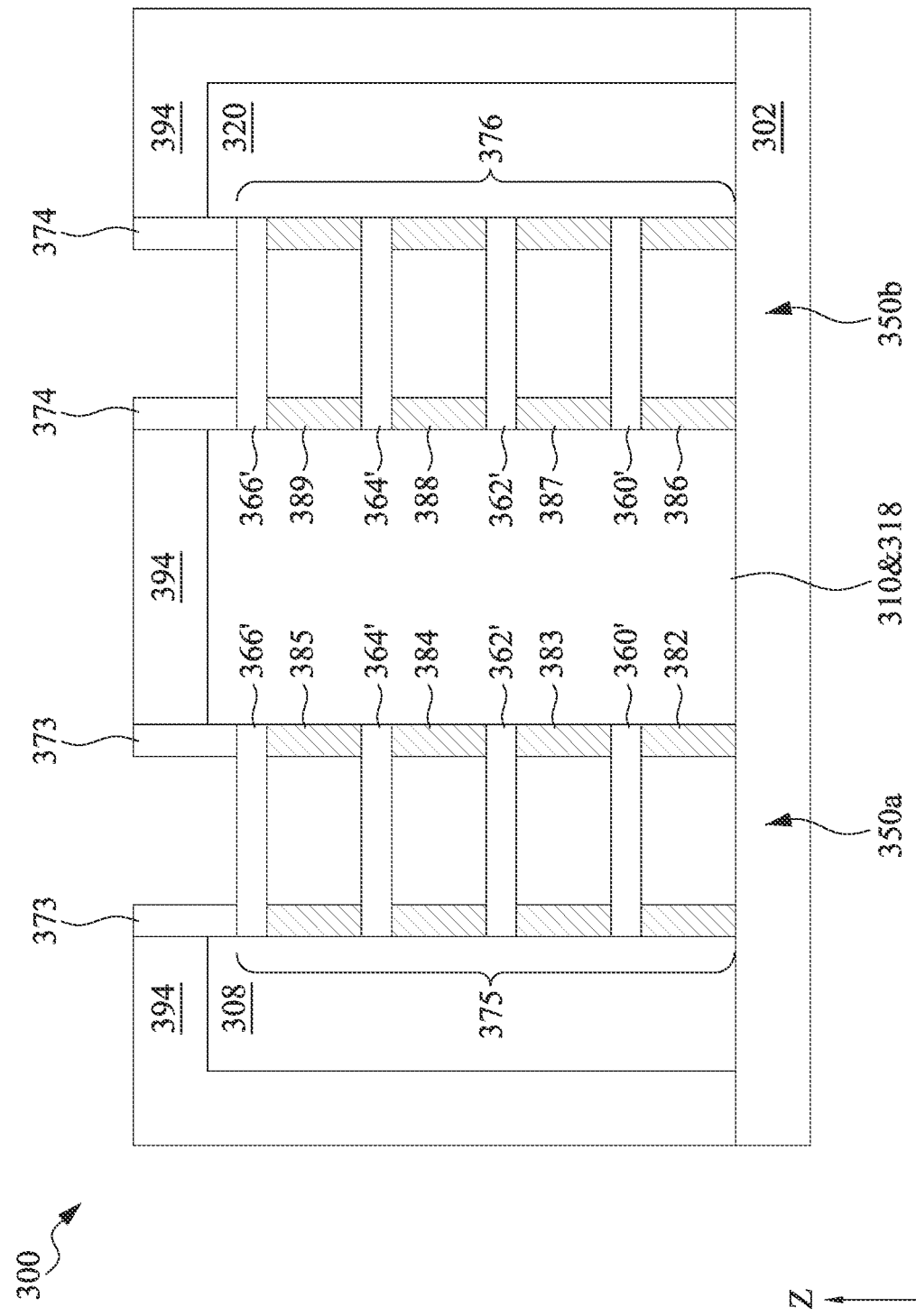

Corresponding to operation 422, FIG. 15 is a cross-sectional view of the memory cell 300, cut along line A-A' (FIG. 3A), in which the etched SiGe sacrificial nanostructures 378, 379, 380, and 381 are removed, at one of the various stages of fabrication. In some embodiments, the etched SiGe sacrificial nanostructures 378, 379, 380, and 381 of both of the alternating-nanostructure columns 375 and 376 are removed. The etched SiGe sacrificial nanostructures 378, 379, 380, and 381 can be removed by applying a selective etch (e.g., a hydrochloric acid (HCl)).

After the removal of the etched SiGe sacrificial nanostructures 378, 379, 380, and 381, respective bottom boundaries of the defined Si nanostructures 360', 362', 364', and 366' of both of the alternating-nanostructure columns 375 and 376 may be exposed. It is noted that the bottom boundaries may be fully exposed when viewed along the X direction, but partially exposed (because of the inner spacers 382-389) when viewed along the Y direction (FIG. 15).

According to some embodiments of the present disclosure, the partially exposed defined Si nanostructures 360', 362', 364', and 366' of the alternating-nanostructure column 375 may be collectively configured as a conduction channel of the programming transistor 350a (FIG. 3A); and the partially exposed defined Si nanostructures 360', 362', 364', and 366' of the alternating-nanostructure column 376 may be collectively configured as a conduction channel of the reading transistor 350b (FIG. 3A). As such, the partially exposed defined Si nanostructures 360', 362', 364', and 366' of the alternating-nanostructure column 375 may herein be referred to as "conduction channel 395a;" and the partially exposed defined Si nanostructures 360', 362', 364', and 366' of the alternating-nanostructure column 376 may herein be referred to as "conduction channel 395b." The conduction channel 395a and 395b is configured to conduct current flowing through the programming transistor 305a and reading transistor 305b, respectively. In general, such a conduction channel has a length and a width. The length may be in parallel with the current, and the width may be in perpendicular to the current. Although four Si nanostructures are formed as the conduction channels of the programming transistor 305a and reading transistor 305b of the memory cell 300, it is understood that a memory device, fabricated by the method disclosed herein, can include any number of nanostructures to form its conduction channel(s) while remaining within the scope of the present disclosure.

Figure 16:
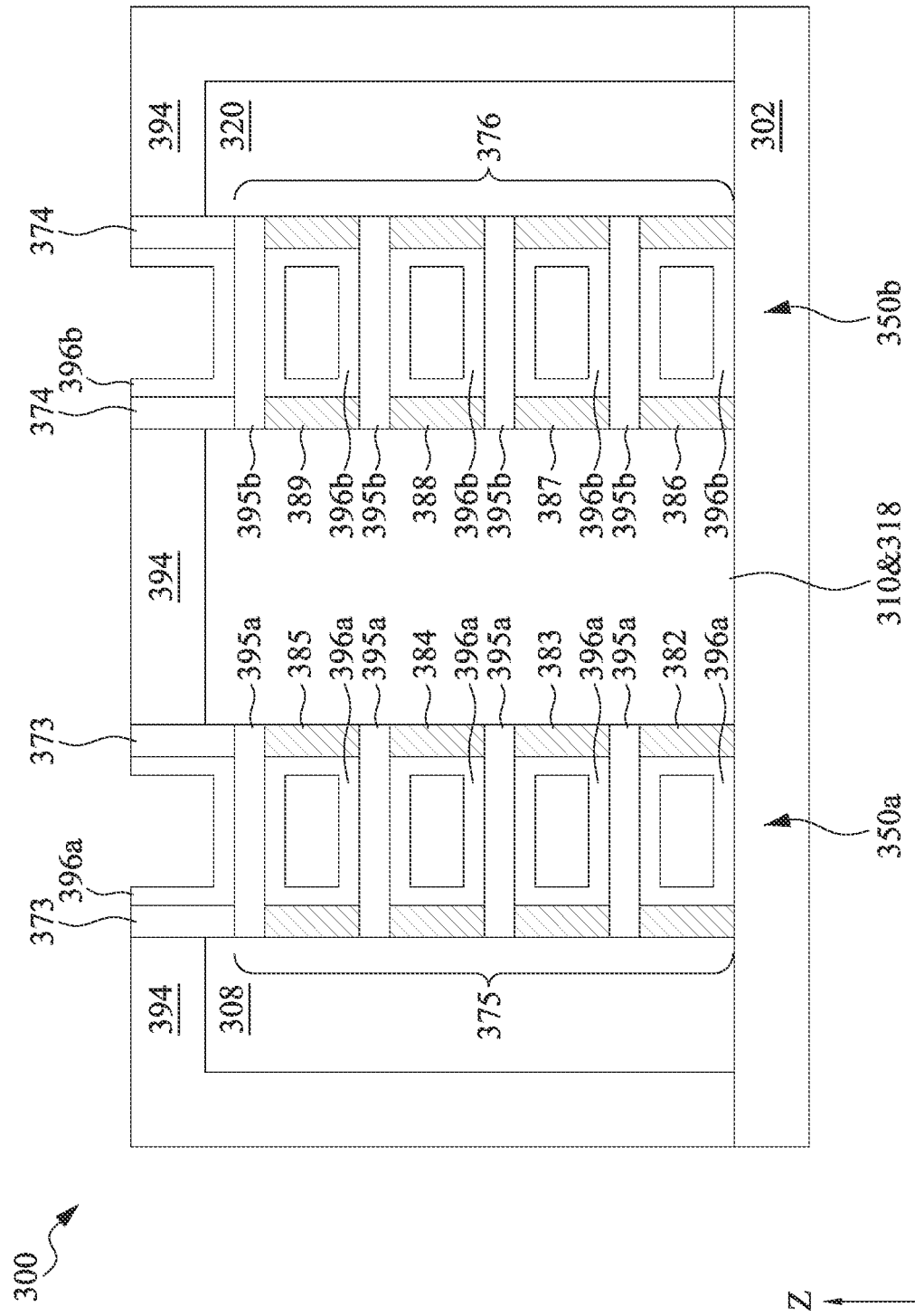

Corresponding to operation 424, FIG. 16 is a cross-sectional view of the memory cell 300, cut along line A-A' (FIG. 3A), that includes gate dielectrics 396a and 396b, at one of the various stages of fabrication. The gate dielectric 396a can wrap around each of the Si nanostructures of the conduction channel 395a; and the gate dielectric 396b can wrap around each of the Si nanostructures of the conduction channel 395b. The gate dielectrics 396a and 396b may be formed of different high-k dielectric materials or an identical high-k dielectric material. The gate dielectrics 396a and 396b may include a stack of multiple high-k dielectric materials. The gate dielectrics 396a and 396b can be deposited using any suitable method, including, for example, atomic layer deposition (ALD). In some embodiments, the gate dielectrics 396a and 396b may optionally include a substantially thin oxide (e.g., $SiO_x$) layer.

Figure 17:
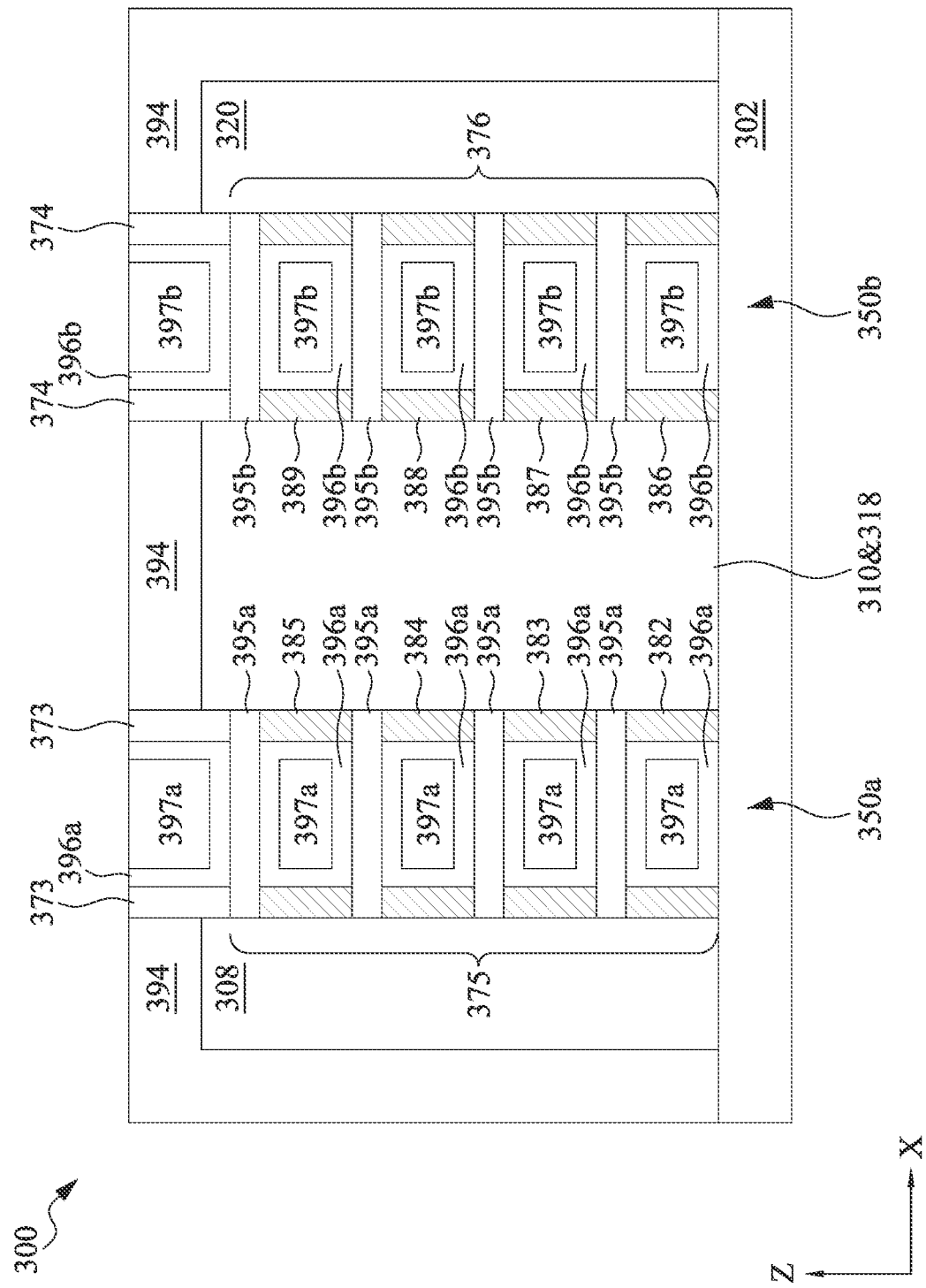

Corresponding to operation 426, FIG. 17 is a cross-sectional view of the memory cell 300, cut along line A-A' (FIG. 3A), that includes the gate metals 397a and 397b, at one of the various stages of fabrication. The gate metal 397a can wrap around each of the Si nanostructures of the conduction channel 395a with the gate dielectric 396a disposed therebetween; and the gate metal 397b can wrap around each of the Si nanostructures of the conduction channel 395b with the gate dielectric 396b disposed therebetween. The gate metals 397a and 397b may be formed of different metal materials or an identical metal material. The gate metals 397a and 397b may include a stack of multiple metal materials. It is appreciated that the gate metals 397a and 397b may include any of other conductor materials while remaining within the scope of the present disclosure. The gate metals 397a and 397b can be deposited using any suitable method, including, for example, CVD. In some embodiments, the gate metal 397a, the corresponding gate dielectric 396a, and the offset gate spacers 373 may be collectively referred to as a gate structure, e.g., the gate structure 304 shown in FIG. 3A. Similarly, the gate metal 397b, the corresponding gate dielectric 396b, and the offset gate spacers 374 may be collectively referred to as a gate structure, e.g., the gate structure 314 shown in FIG. 3A.

In some embodiments, after forming the gate structures 304 and 314, one or more interconnection structures may be formed to connect each of the gate structure 304, the gate structure 314, and the source 320 to connect the memory cell 300 to other components or devices. For example, one or more interconnection structures (e.g., a via structure typically known as VG) may be formed over the gate structure 304 to connect the gate structure 304 to one or more upper metal layers, which may include a WLP; one or more interconnection structures (e.g., a metal structure typically known as MD, a via structure typically known as VD) may be formed over the gate structure 314 to connect the gate structure 314 to one or more upper metal layers, which may include a WLR; and one or more interconnection structures (e.g., a via structure) may be formed through the ILD 394 and over the source 320 to connect the source 320 to one or more upper metal layers, which may include a BL. As such, the memory cell 300, as an example anti-fuse memory cell, can be connected to one or more other memory cells similar to the memory cell 300. For example, a number of such memory cell 300 may be arranged (e.g., coupled) to each other by respective WLPs, reading WLs, and BLs to form a memory array.

In one aspect of the present disclosure, a semiconductor device is disclosed. The semiconductor device includes a plurality of first nanostructures vertically separated from one another, a first gate structure wrapping around each of the plurality of first nanostructures, a plurality of second nanostructures vertically separated from one another, a second gate structure wrapping around each of the plurality of second nanostructures, a first drain/source structure coupled to a first end of each of the first nanostructures, a second drain/source structure coupled to both of a second end of each of the first nanostructures and a first end of each of the second nanostructures, and a third drain/source structure coupled to a second end of each of the second nanostructures. The first drain/source structure has a first doping type, the second and third drain/source structures have a second doping type, and the first doping type is opposite to the second doping type.

In another aspect of the present disclosure, a memory device is disclosed. The memory device includes a plurality of memory cells, wherein each of the memory cells has a first transistor and a second transistor coupled to each other in series, a first access line operatively coupled to a respective gate of each of the first transistors, and a second access line operatively coupled to a respective gate of each of the second transistors. Each of the first transistors has a first drain terminal and a first source terminal and each of the second transistors has a second drain terminal and a second source terminal. The first drain terminals have a first conduction type, and the first source terminals, the second drain terminal, and the second source terminal have a second conduction type opposite to the first conduction type.

In yet another aspect of the present disclosure, a method for operating a memory device is disclosed. The method includes forming a first transistor having a first gate terminal, a first source terminal, and a first drain terminal, wherein the first drain terminal has a first conduction type and the first source terminal has a second conduction type opposite to the first conduction type. The method also includes forming a second transistor having a second gate terminal, a second source terminal, and a second drain terminal, wherein the second drain terminal and the second source terminal have the second conduction type. The method further includes floating the first drain terminal, connecting the first source terminal to the second drain terminal, and connecting the second source terminal to a bit line; and applying a voltage on the first gate terminal to form a resistor across the first gate terminal and the first source terminal.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a plurality of first nanostructures vertically separated from one another;
a first gate structure wrapping around each of the plurality of first nanostructures;
a plurality of second nanostructures vertically separated from one another;
a second gate structure wrapping around each of the plurality of second nanostructures;
a first drain/source structure coupled to a first end of each of the first nanostructures;
a second drain/source structure coupled to both of a second end of each of the first nanostructures and a first end of each of the second nanostructures; and
a third drain/source structure coupled to a second end of each of the second nanostructures;
wherein the first drain/source structure has a first doping type, the second and third drain/source structures have a second doping type, and the first doping type is opposite to the second doping type.

2. The semiconductor device of claim 1, wherein each of the first nanostructures includes a first portion with a higher concentration of the first doping type and a second portion with a lower concentration of the first doping type, and each of the second nanostructure is with the first doping type.

3. The semiconductor device of claim 2, wherein the first portion is located closer to the first drain/source structure than to the second drain/source structure, and the second portion is located closer to the second drain/source structure than to the first drain/source structure.

4. The semiconductor device of claim 2, wherein a ratio of the first portion to the second portion is about 1.

5. The semiconductor device of claim 2, wherein a ratio of the first portion to the second portion is less than or greater than 1.

6. The semiconductor device of claim 1, wherein the first doping type is a p-type, and the second doping type is an n-type.

7. The semiconductor device of claim 1, wherein the first gate structure includes a first gate dielectric and a first gate metal, and the second gate structure includes a second gate dielectric and a second gate metal.

8. The semiconductor device of claim 7, wherein at least a portion of the first gate dielectric is broken down to form a resistor across the first gate structure and the second drain/source structure.

9. The semiconductor device of claim 1, wherein the first drain/source structure is floating and the third drain/source structure is operatively connected to a bit line, with the first gate structure and second gate structure connected to a programming word line and a reading word line, respectively.

10. A memory device, comprising:
a plurality of memory cells, wherein each of the memory cells has a first transistor and a second transistor coupled to each other in series;
a first access line operatively coupled to a respective gate of each of the first transistors; and
a second access line operatively coupled to a respective gate of each of the second transistors;
wherein each of the first transistors has a first drain terminal and a first source terminal and each of the second transistors has a second drain terminal and a second source terminal; and
wherein the first drain terminals have a first conduction type, and the first source terminals, the second drain terminals, and the second source terminals have a second conduction type opposite to the first conduction type,
wherein the first access line includes a first word line that programs each of the memory cells, and the second access line includes a second word line that reads each of the memory cells, wherein the first word line provides a breakdown voltage to convert at least one of the first transistors to a resistor.

11. The memory device of claim 10, wherein the first drain terminals are each floating.

12. The memory device of claim 10, wherein the second source terminals are connected to respective bit lines.

13. The memory device of claim 10, wherein the first conduction type is a p-type, and the second conduction type is an n-type.

14. The memory device of claim 10, wherein each of the first transistors has a first channel operating as a combination of a p-type and an n-type, and each of the second transistors has a second channel operating as the n-type.

15. The memory device of claim 14, wherein the first channel includes a plurality of first nanosheets coupled between the first source terminal and the first drain terminal, and the second channel includes a plurality of second nanosheets coupled between the second source terminal and the second drain terminal.

16. A method for operating a memory device, comprising:
forming a first transistor having a first gate terminal, a first source terminal, and a first drain terminal, wherein the first drain terminal has a first conduction type and the first source terminal has a second conduction type opposite to the first conduction type;

forming a second transistor having a second gate terminal, a second source terminal, and a second drain terminal, wherein the second drain terminal and the second source terminal have the second conduction type;

floating the first drain terminal, connecting the first source terminal to the second drain terminal, and connecting the second source terminal to a bit line; and applying a voltage on the first gate terminal to form a resistor across the first gate terminal and the first source terminal.

17. The method of claim 16, wherein the first conduction type is a p-type, and the second conduction type is an n-type.

18. The method of claim 16, wherein the first transistor has a first channel operating as a combination of a p-type and an n-type, and the second transistor has a second channel operating as the n-type.

\* \* \* \* \*